(12) United States Patent
Jeon

(10) Patent No.: US 11,538,408 B2
(45) Date of Patent: Dec. 27, 2022

(54) ORGANIC LIGHT-EMITTING DIODE DISPLAY

(71) Applicant: SAMSUNG DISPLAY CO., LTD., Yongin-si (KR)

(72) Inventor: Jin Jeon, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/196,120

(22) Filed: Mar. 9, 2021

(65) Prior Publication Data

US 2021/0193038 A1 Jun. 24, 2021

Related U.S. Application Data

(60) Continuation of application No. 15/885,513, filed on Jan. 31, 2018, now Pat. No. 10,943,534, which is a (Continued)

(30) Foreign Application Priority Data

Jul. 7, 2015 (KR) .................. 10-2015-0096614

(51) Int. Cl.
*G09G 3/3233* (2016.01)
*H01L 27/32* (2006.01)

(52) U.S. Cl.
CPC ....... *G09G 3/3233* (2013.01); *H01L 27/3262* (2013.01); *H01L 27/3272* (2013.01);
(Continued)

(58) Field of Classification Search
CPC ........ G09G 3/3208; G09G 3/30; G09G 3/006; G09G 2300/0426
See application file for complete search history.

(56) References Cited

U.S. PATENT DOCUMENTS

| 5,535,028 A | 7/1996 | Bae et al. |
| 9,105,589 B2 | 8/2015 | Bang |

(Continued)

FOREIGN PATENT DOCUMENTS

| JP | 2012-208214 A | 10/2012 |
| KR | 10-2010-0011525 | 2/2010 |

(Continued)

OTHER PUBLICATIONS

Office Action dated Oct. 6, 2021 in corresponding Korean Patent Application No. 10-2015-0096614, 5 pages, in Korean.
(Continued)

*Primary Examiner* — Yuzhen Shen
(74) *Attorney, Agent, or Firm* — F. Chau & Associates, LLC

(57) ABSTRACT

An organic light emitting diode (OLED) display is disclosed. In one aspect, the display includes a scan line transmitting a scan signal, a data line crossing the scan line and transmitting a data voltage, and a driving voltage line crossing the scan line and configured to transmit a driving voltage. The display also includes a switching transistor electrically connected to the scan line and the data line. The display further includes a driving transistor and a compensation transistor. A driving gate electrode and a driving drain electrode are respectively connected to a compensation source electrode and a compensation drain electrode. The display also includes a light blocking layer at least partially covering the compensation transistor and an OLED electrically connected to the driving transistor.

19 Claims, 15 Drawing Sheets

Related U.S. Application Data division of application No. 15/203,644, filed on Jul. 6, 2016, now Pat. No. 10,909,917.

(52) U.S. Cl.
CPC .  *H01L 27/3276* (2013.01); *G09G 2300/0426* (2013.01); *G09G 2300/0819* (2013.01); *G09G 2300/0842* (2013.01); *G09G 2300/0861* (2013.01); *G09G 2310/0262* (2013.01); *G09G 2320/0233* (2013.01); *G09G 2320/0242* (2013.01); *G09G 2320/0247* (2013.01); *H01L 27/3216* (2013.01); *H01L 27/3218* (2013.01)

(56) References Cited

U.S. PATENT DOCUMENTS

| | | | |
|---|---|---|---|
| 9,412,297 | B2 | 8/2016 | Kim |
| 9,767,730 | B2 | 9/2017 | Kim |
| 10,909,917 | B2 | 2/2021 | Jeon |
| 2006/0151745 | A1 | 7/2006 | Kim et al. |
| 2006/0170634 | A1* | 8/2006 | Kwak ............... G09G 3/3233 345/92 |
| 2007/0194326 | A1 | 8/2007 | Huh |
| 2009/0201231 | A1* | 8/2009 | Takahara ............ G09G 3/3233 345/76 |
| 2010/0007681 | A1 | 1/2010 | Kubota |
| 2012/0026148 | A1 | 2/2012 | Kim |
| 2012/0127220 | A1* | 5/2012 | Noguchi ............ G09G 3/3233 345/77 |
| 2013/0119412 | A1 | 5/2013 | Kasai et al. |
| 2013/0120341 | A1 | 5/2013 | Kasai et al. |
| 2013/0257839 | A1* | 10/2013 | Hyeon ............... G09G 3/3258 345/82 |
| 2014/0070184 | A1 | 3/2014 | Shin |
| 2014/0097439 | A1 | 4/2014 | Jeon |
| 2014/0117340 | A1 | 5/2014 | Kim |
| 2014/0118232 | A1 | 5/2014 | Kim |
| 2014/0132584 | A1 | 5/2014 | Kim |
| 2014/0138644 | A1 | 5/2014 | Park et al. |
| 2015/0187276 | A1 | 7/2015 | Shim et al. |
| 2016/0351124 | A1 | 12/2016 | Kim et al. |
| 2017/0186833 | A1 | 6/2017 | Ota et al. |
| 2018/0158410 | A1 | 6/2018 | Jeon |

FOREIGN PATENT DOCUMENTS

| | | |
|---|---|---|
| KR | 10-2013-0091136 | 8/2013 |
| KR | 10-2014-0053601 | 5/2014 |
| KR | 10-2014-0053602 | 5/2014 |
| KR | 10-2015-0071319 | 6/2015 |

OTHER PUBLICATIONS

U.S. Final Office Action dated Feb. 23, 2018 for U.S. Appl. No. 15/203,644.

Office Action dated Mar. 12, 2019 in corresponding U.S. Appl. No. 15/203,644.

Office Action dated Dec. 2, 2019 in corresponding U.S. Appl. No. 15/203,644.

Office Action dated Mar. 20, 2020 in corresponding U.S. Appl. No. 15/203,644.

Office Action dated Oct. 19, 2016 in corresponding U.S. Appl. No. 15/203,644.

\* cited by examiner

ORGANIC LIGHT-EMITTING DIODE DISPLAY

CROSS-REFERENCE TO RELATED APPLICATION

Any and all priority claims identified in the Application Data Sheet, or any correction thereto, are hereby incorporated by reference under 37 CFR 1.57. For example, this application is continuation application of U.S. patent application Ser. No. 15/885,513, which is a divisional of U.S. patent application Ser. No. 15/203,644, filed Jul. 6, 2016, which claims priority to and the benefit of Korean Patent Application No. 10-2015-0096614 filed in the Korean Intellectual Property Office on Jul. 7, 2015, the entire contents of these documents are incorporated herein by reference.

BACKGROUND

Field

The described technology generally relates to an organic light-emitting diode display.

Description of the Related Technology

An organic light-emitting diode (OLED) includes two electrodes and an interposed organic light emitting layer. Electrons injected from a cathode electrode and holes injected from an anode electrode are bonded to each other in the organic light emitting layer to form excitons. Light is emitted while the excitons discharge energy.

The OLED display includes a matrix of pixels including an OLED, and transistors and capacitors for driving the OLED. The transistors typically include a switching transistor and a driving transistor.

When leakage current occurs in a compensation transistor connected to a capacitor, voltage across the capacitor increases, and thus a deterioration of luminance occurs during a frame.

Since the leakage current increases proportionally to the amount of external light, when external light increases, luminance degrades or color coordination changes.

In addition, luminance fluctuates during each frame, which increases flickering, and the flickering increases more for the OLED display driven with a low frequency. Thus, low frequency driving, which is used to reduce power consumption, is difficult to implement in an OLED display.

The above information disclosed in this Background section is only to enhance the understanding of the background of the described technology and therefore it may contain information that does not form the prior art that is already known in this country to a person of ordinary skill in the art.

SUMMARY OF CERTAIN INVENTIVE ASPECTS

One inventive aspect relates to an OLED display that can prevent luminance deterioration and flickering due to external light.

Another aspect is an OLED display that includes: a substrate; a scan line formed on the substrate and transmitting a scan signal; a data line and driving voltage line crossing the scan line and respectively transmitting a data voltage and a driving voltage; a switching transistor connected to the scan line and the data line; a driving transistor connected to the switching transistor and including a driving gate electrode, a driving source electrode and a driving drain electrode; a compensation transistor including a compensation gate electrode, a compensation source electrode, and a compensation drain electrode, wherein the driving gate electrode and the driving drain electrode are respectively connected to the compensation source electrode and the compensation drain electrode; a light blocking member covering the compensation transistor; and an OLED connected to the driving transistor.

The OLED display may further include a semiconductor member formed between the substrate and the scan line, and curved in a plan view, in which the compensation transistor includes a first compensation transistor and a second compensation transistor disposed to be adjacent to each other, the first compensation transistor includes a first compensation channel that is an area of the semiconductor member, a first compensation gate electrode overlapping the first compensation channel, and a first compensation source electrode and a first compensation drain electrode disposed at respective sides of the first compensation channel, and the light blocking member may cover the first compensation source electrode and the first compensation drain electrode.

The light blocking member may be formed on the same layer as the data line.

The first compensation source electrode and the first compensation drain electrode may be formed on the same layer as the first compensation channel.

The first compensation gate electrode may be a projection extending from the scan line.

The OLED display may further include a formed on the same layer as the light blocking member and connecting the first compensation drain electrode with the driving gate electrode.

The light blocking member may be connected with the driving connecting member.

The second compensation transistor may include a second compensation channel that is another area of the semiconductor member, a second compensation gate electrode overlapping the second compensation channel, and a second compensation source electrode and a second compensation drain electrode disposed at respective sides of the second compensation channel, and the light blocking member may cover the second compensation source electrode and the second compensation drain electrode.

The light blocking member may be separated from the driving connecting member.

The OLED may include a pixel electrode electrically connected to the driving transistor, an organic emission layer formed on the pixel electrode, and a common electrode formed on the organic emission layer, and the light blocking member may be formed on the same layer as the pixel electrode.

The light blocking member may be connected with the pixel electrode.

The second compensation transistor may include a second compensation channel that is another area of the semiconductor member, a second compensation gate electrode overlapping the second compensation channel, and a second compensation source electrode and a second compensation drain electrode disposed at respective sides of the second compensation channel, and the light blocking member may cover the second compensation source electrode and the second compensation drain electrode.

The light blocking member may be separated from the pixel electrode.

The OLED display may further include an initialization voltage line formed on the same layer as the pixel electrode and transmitting an initialization voltage initializing the driving transistor, in which the light blocking member is connected with the initialization voltage line.

The semiconductor member may further include a driving channel of the driving transistor connected with the switching transistor, and the driving channel is curved in a plan view.

Another aspect is an organic light-emitting diode (OLED) display, comprising: a substrate; a scan line formed over the substrate and configured to transmit a scan signal; a data line crossing the scan line and configured to transmit a data voltage; a driving voltage line crossing the scan line and configured to transmit a driving voltage; a switching transistor electrically connected to the scan line and the data line; a driving transistor electrically connected to the switching transistor and including a driving gate electrode, a driving source electrode, and a driving drain electrode; a compensation transistor including a compensation gate electrode, a compensation source electrode, and a compensation drain electrode, wherein the driving gate electrode and the driving drain electrode are respectively connected to the compensation source electrode and the compensation drain electrode; a light blocking layer at least partially covering the compensation transistor; and an OLED electrically connected to the driving transistor.

The above OLED display further comprises a semiconductor layer interposed between the substrate and the scan line, wherein the semiconductor layer is non-linear, wherein the compensation transistor includes a first compensation transistor and a second compensation transistor adjacent to each other, wherein the first compensation transistor includes a first compensation channel including a first area of the semiconductor layer, a first compensation gate electrode overlapping the first compensation channel in the depth dimension of the OLED display, and first source and drain electrodes formed at opposing sides of the first compensation channel, and wherein the light blocking layer covers the first compensation source and drain electrodes.

In the above OLED display, the light blocking layer is formed on the same layer as the data line.

In the above OLED display, the first compensation source and drain electrodes are formed on the same layer as the first compensation channel.

In the above OLED display, the first compensation gate electrode extends from the scan line.

The above OLED display further comprises a driving connecting layer formed on the same layer as the light blocking layer, wherein the driving connecting layer is configured to electrically connect the first compensation drain electrode to the driving gate electrode.

In the above OLED display, the light blocking layer is connected to the driving connecting layer.

In the above OLED display, the second compensation transistor includes a second compensation channel including a second area of the semiconductor layer, a second compensation gate electrode overlapping the second compensation channel in the depth direction of the OLED display, and second compensation source and drain electrodes formed at opposing sides of the second compensation channel, wherein the light blocking layer covers the second compensation source and drain electrodes.

In the above OLED display, the light blocking layer is separated from the driving connecting layer.

In the above OLED display, the OLED includes: a pixel electrode electrically connected to the driving transistor; an organic emission layer formed over the pixel electrode; and a common electrode formed over the organic emission layer, wherein the light blocking layer is formed on the same layer as the pixel electrode.

In the above OLED display, the light blocking layer is connected to the pixel electrode.

In the above OLED display, the second compensation transistor includes a second compensation channel including a third area of the semiconductor layer, a second compensation gate electrode overlapping the second compensation channel in the depth dimension of the OLED display, and second compensation source and drain formed at opposing sides of the second compensation channel, wherein the light blocking layer covers the second compensation source and drain electrodes.

In the above OLED display, the light blocking layer is separated from the pixel electrode.

The above OLED display further comprises an initialization voltage line formed on the same layer as the pixel electrode and configured to transmit an initialization voltage configured to initialize the driving transistor, wherein the light blocking layer is connected to the initialization voltage line.

In the above OLED display, the semiconductor layer further includes a driving channel of the driving transistor connected to the switching transistor, and wherein the driving channel is non-linear.

Another aspect is an organic light-emitting diode (OLED) display, comprising: a plurality of pixel circuits, each pixel circuit comprising: a plurality of compensation transistors including a first compensation transistor and a second compensation transistor electrically connected to each other; a light blocking layer at least partially covering the first compensation transistor to block at least a portion of external light from reaching the compensation transistor; and an OLED electrically connected to the compensation transistor.

In the above OLED display, the light blocking layer does not overlap the second compensation transistor in the depth dimension of the OLED display.

The above OLED display further comprises: a scan line configured to provide a scan signal; a driving transistor comprising a driving gate electrode; and a driving connecting layer configured to electrically connect the driving gate electrode to a first compensation drain electrode of the first compensation transistor, wherein the light blocking layer includes an extended portion of one of the driving connecting and the scan line.

In the above OLED display, the OLED includes a pixel electrode, wherein the light blocking layer is an extended portion of the pixel electrode.

The above OLED display further comprises: a driving transistor electrically connected to the compensation transistors; and an initialization voltage line configured to provide an initialization voltage to the driving transistor, wherein the light blocking layer includes an extended portion of the initialization voltage line.

According to at least one of the disclosed embodiments, due to the formation of the light blocking member covering the compensation transistor connected to the storage capacitor, external light may be prevented from entering the compensation transistor, thereby preventing current leakage from occurring in the compensation transistor.

Accordingly, the deterioration of luminance and the change of color coordination due to the current leakage may be prevented.

Also, the flickering due to the current leakage may be prevented, enabling manufacturing of the OLED display with the low frequency driving type and/or a low voltage.

DETAILED DESCRIPTION OF CERTAIN INVENTIVE EMBODIMENTS

Figure 1:
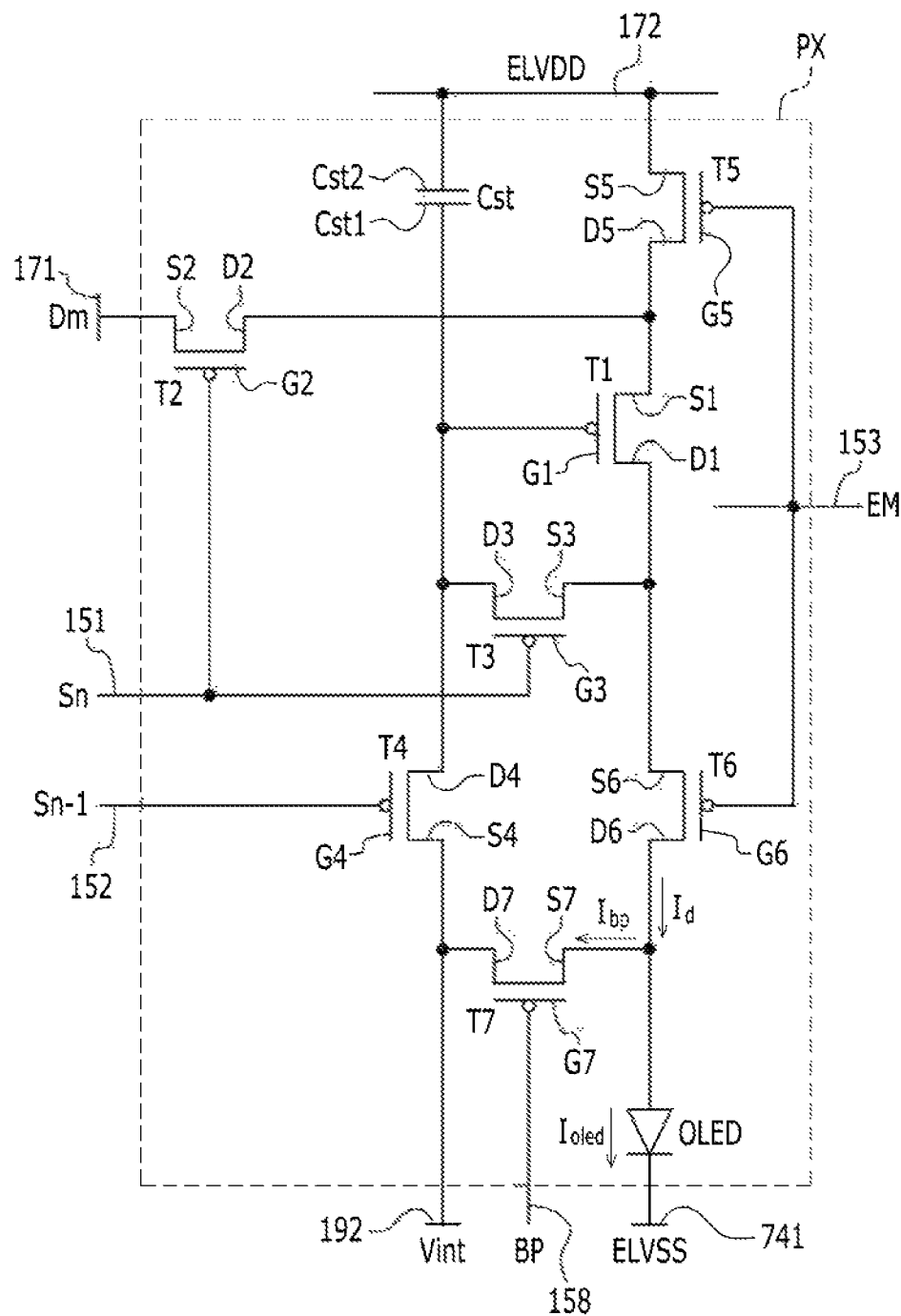
FIG. 1 is an equivalent circuit diagram of a pixel of an OLED display according to an exemplary embodiment of the present disclosure.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In order to clearly describe the present disclosure, portions that are not connected with the description will be omitted. Like reference numerals designate like elements throughout the specification.

Further, in the drawings, a size and thickness of each element are randomly represented for better understanding and ease of description, and the present disclosure is not limited thereto.

In the drawings, the thickness of layers, films, panels, regions, etc., are exaggerated for clarity.

In the drawings, the thicknesses of some layers and areas are exaggerated for convenience of explanation.

In addition, unless explicitly described to the contrary, the word "comprise" and variations such as "comprises" or "comprising" will be understood to imply the inclusion of stated elements but not the exclusion of any other elements.

Further, it will be understood that when an element such as a layer, film, region, or substrate is referred to as being "on" another element, it can be directly on the other element or intervening elements may also be present.

Further, in the specification, the word "on" means positioning on or below the object portion, but does not necessarily mean positioning on the upper side of the object portion based on a gravitational direction.

Further, in the specification, the word "in a plan view" means when an object portion is viewed from the above, and the word "in cross section" means when a cross section taken by vertically cutting an object portion is viewed from the side.

Further, in the accompanying drawings, an active matrix (AM) type of OLED display is illustrated to have a 7Tr-1Cap structure in which seven transistors and one capacitor are provided for one pixel, but the present disclosure is not limited thereto.

Thus, in the OLED display, each pixel may be provided with a plurality of transistors and at least one capacitor, and may be formed to have various structures by further forming additional wires or omitting existing wires.

In this case, a pixel means a minimum unit which displays an image, and the organic light emitting device displays an image through a plurality of pixels.

Hereinafter, an OLED display according to an exemplary embodiment of the present disclosure will be described with reference to the accompanying drawings. In this disclosure, the term "substantially" includes the meanings of completely, almost completely or to any significant degree under some applications and in accordance with those skilled in the art. The term "connected" can include an electrical connection.

FIG. 1 is an equivalent circuit diagram of a pixel of an OLED display according to an exemplary embodiment of the present disclosure.

As shown in FIG. 1, the OLED display according to an exemplary embodiment of the present disclosure includes a plurality of signal lines 151, 152, 153, 158, 171, 172, and 192, and a plurality of pixels PX arranged in a matrix and connected to the plurality of signal lines.

One pixel PX includes a plurality of transistors T1, T2, T3, T4, T5, T6, and T7, a storage capacitor Cst and an OLED, which are connected to the plurality of signal lines 151, 152, 153, 158, 171, 172, and 192.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 151, 152, 153, 158, 171, 172, and 192 include a scan line 151 transmitting a scan signal Sn, a previous scan line 152 transmitting a previous scan signal Sn−1 to the initialization transistor T4, a light emission control line 153 transmitting a light emission control signal EM to the operation control transistor T5 and the light emission control transistor T6, a bypass control line 158 transmitting a bypass signal BP to the bypass transistor T7, a data line 171 crossing the scan line 151 and transmitting a data signal Dm, a driving voltage line 172 transmitting a driving voltage ELVDD and formed to be substantially parallel to the data line 171, and an initialization voltage line 192 transmitting an initialization voltage Vint initializing the driving transistor T1.

A gate electrode G1 of the driving transistor T1 is connected with one end Cst1 of the storage capacitor Cst, and a source electrode S1 of the driving transistor T1 is connected with the driving voltage line 172 via the operation control transistor T5. A drain electrode D1 of the driving transistor T1 is electrically connected to an anode of the OLED via the light emission control transistor T6.

The driving transistor T1 receives the data signal Dm according to a switching operation of the switching transistor T2 to supply a driving current Id to the OLED.

A gate electrode G2 of the switching transistor T2 is connected to the scan line 151, and a source electrode S2 of the switching transistor T2 is connected to the data line 171 A drain electrode D2 of the switching transistor T2 is connected to the source electrode S1 of the driving transistor T1 and to the driving voltage line 172 via the operation control transistor T5.

The switching transistor T2 performs a switching operation so as to be turned on according to the scan signal Sn received through the scan line 151 to transmit the data signal Dm transmitted to the data line 171 to the source electrode of the driving transistor T1.

A gate electrode G3 of the compensation transistor T3 is directly connected to the scan line 151, A source electrode S3 of the compensation transistor T3 is connected to the drain electrode D1 of the driving transistor T1 and to an anode of the OLED via the light emission control transistor T6. A drain electrode D3 of the compensation transistor T3 is connected to one end Cst1 of the storage capacitor Cst and the drain electrode D4 of the initialization transistor T4, together with the gate electrode G1 of the driving transistor T1.

The compensation transistor T3 is turned on according to the scan signal Sn received through the scan line 151 to connect the gate electrode G1 and the drain electrode D1 of the driving transistor T1 and diode-connect the driving transistor T1.

A gate electrode G4 of the initialization transistor T4 is connected to the previous scan line 152, and a source electrode S4 of the initialization transistor T4 is connected to an initialization voltage line 192. A drain electrode D4 of the initialization transistor T4 is connected to one end Cst1 of the storage capacitor Cst and the gate electrode G1 of the driving transistor T1, together through the drain electrode D3 of the compensation transistor T3. The initialization transistor T4 performs an initialization operation so as to be turned on according to the previous scan signal Sn−1 received through the previous scan line 152 to transmit the initialization voltage Vint to the gate electrode G1 of the driving transistor T1 and then to initialize a gate voltage of the gate electrode G1 of the driving transistor T1.

A gate electrode G5 of the operation control transistor T5 is connected to the light emission control line 153, and a source electrode S5 of the operation control transistor T5 is connected to the driving voltage line 172. A drain electrode D5 of the operation control transistor T5 is connected to the source electrode S1 of the driving transistor T1 and the drain electrode S2 of the switching transistor T2.

A gate electrode G6 of the light emission control transistor T6 is connected to the light emission control line 153, and the source electrode S6 of the first light emission control transistor T6 is connected to the drain electrode D1 of the driving transistor T1 and the source electrode S3 of the compensation transistor T3. The drain electrode D6 of the first light emission control transistor T6 is electrically connected to the anode of the OLED.

The operation control transistor T5 and the first light emission control transistor T6 are substantially simultaneously (or concurrently) turned on according to the light emission control signal EM transmitted to the light emission control line 153 such that the driving voltage ELVDD is compensated through the diode-connected driving transistor T1 and is transmitted to the OLED.

A gate electrode G7 of the bypass transistor T7 is connected to the bypass control line 158, and a source electrode S7 of the bypass transistor T7 is connected to both the drain electrode D6 of the light emission control transistor T6 and the anode of the OLED. A drain electrode D7 of the bypass transistor T7 is connected to both the initialization voltage line 192 and the source electrode S4 of the initialization transistor T4.

The other end Cst2 of the capacitor Cst is connected to the driving voltage line 172 and a cathode of the OLED is connected to the common voltage line 741 transmitting a common voltage ELVSS.

Meanwhile, in the exemplary embodiment of the present disclosure, the seven-transistor and one-capacitor structure including the bypass transistor T7 is illustrated, but the present disclosure is not limited thereto, and the number of transistors and the number of capacitors may be variously changed.

Hereinafter, a detailed operation process of one pixel of the OLED display according to the exemplary embodiment of the present disclosure will be described in detail with reference to FIG. 2.

Figure 2:
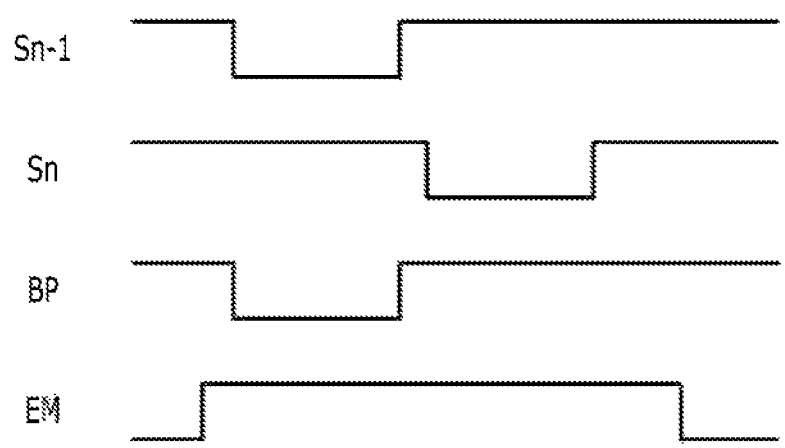
FIG. 2 is a timing diagram of a signal applied to a pixel of an OLED display according to an exemplary embodiment of the present disclosure.

FIG. 2 is a timing diagram of a signal applied to a pixel of an OLED display according to an exemplary embodiment of the present disclosure.

As illustrated in FIG. 2, the previous low-level scan signal Sn−1 is supplied through the previous scan line 152 for an initialization period.

Next, the initialization transistor T4 is turned on depending on the low-level previous scan signal Sn−1, the initialization voltage Vint is connected to the gate electrode G1 of the driving transistor T1 from the initialization voltage line 192 through the initialization transistor T4, and the driving transistor T1 is initialized by the initialization voltage Vint.

Next, the low-level scan signal Sn is supplied through the scan line 151 for a data programming period.

Next, the switching transistor T2 and the compensation transistor T3 are turned on depending on the low-level scan signal Sn.

In this case, the driving transistor T1 is diode-connected by the turned on compensation transistor T3 and is biased forward.

Next, a compensation voltage Dm+Vth (Vth is a negative value), which is the data signal Dm minus a threshold voltage (Vth) of the driving transistor T1 supplied from the data line 171, is applied to the gate electrode G1 of the driving transistor T1.

That is, the gate voltage Vg applied to the gate electrode G1 of the driving transistor T1 is the compensation voltage Dm+Vth.

The driving voltage ELVDD and the compensation voltage Dm+Vth are applied to both ends of the storage capacitor Cst, and a charge corresponding to a voltage difference between both ends is stored in the storage capacitor Cst.

Next, the light control signal EM supplied from the light emission control line 153 is changed from a high level to a low level for a light emission period.

Next, the operation control transistor T5 and the light control transistor T6 are turned on by the low-level light emission control signal Em for the light emission period.

Next, a driving current Id corresponding to a voltage difference between the gate voltage Vg of the gate electrode G1 of the driving transistor T1 and the driving voltage ELVDD is generated, and the driving current Id is supplied to the OLED through the light emission control transistor T6.

A driving gate-source voltage Vgs of the driving transistor T1 is maintained at '(Dm+Vth)−ELVDD' by the storage capacitor Cst for the light emission period, and according to a current-voltage relationship of the driving transistor T1, the driving current Id is proportional to a square '(Dm−ELVDD)$^2$' of a value obtained by subtracting the threshold voltage from the driving gate-source voltage Vgs.

Therefore, the driving current Id is determined regardless of the threshold voltage Vth of the driving transistor T1.

In this case, the bypass transistor T7 receives a bypass signal BP from the bypass control line 158.

Accordingly, the driving current Id is partially discharged through the bypass transistor T7 as a bypass current Ibp.

When the OLED emits light even though a minimum current of the driving transistor T1 displaying a black image flows as a driving current, the black image is not properly displayed.

Therefore, the bypass transistor T7 may disperse some of the minimum current of the driving transistor T1 to current paths other than a current path to the OLED as the bypass current Ibp.

Here, the minimum current of the driving transistor T1 means a current for which the driving gate-source voltage Vgs of the driving transistor T1 is less than the threshold voltage Vth, and thus the driving transistor T1 is turned off.

The minimum driving current (e.g., a current which is equal to or less than about 10 pA) for which the driving transistor T1 is turned off is transmitted to the OLED and is represented by an image of black luminance.

When the minimum driving current representing the black image flows, the effect of the bypass transfer of the bypass current Ibp is significant, but when a large driving current representing an image like a general image or a white image flows, an effect of the bypass current Ibp may be minimal.

Therefore, when the driving current representing the black image flows, a light emitting current Ioled of the OLED, which is reduced by as much as a current amount of the bypass current Ibp exiting from the driving current Id through the bypass transistor T7, has a minimum current amount that is at a level sufficient to represent the black image.

Therefore, an accurate black luminance image is achieved by using the bypass transistor T7 to improve contrast ratio.

In FIG. 2, the bypass signal BP is the same as the previous scan signal Sn−1, but is not necessarily limited thereto.

Next, an arrangement structure of the plurality of pixels of the OLED display shown in FIGS. 1 and 2 will be described in detail with reference to FIG. 3.

Figure 3:
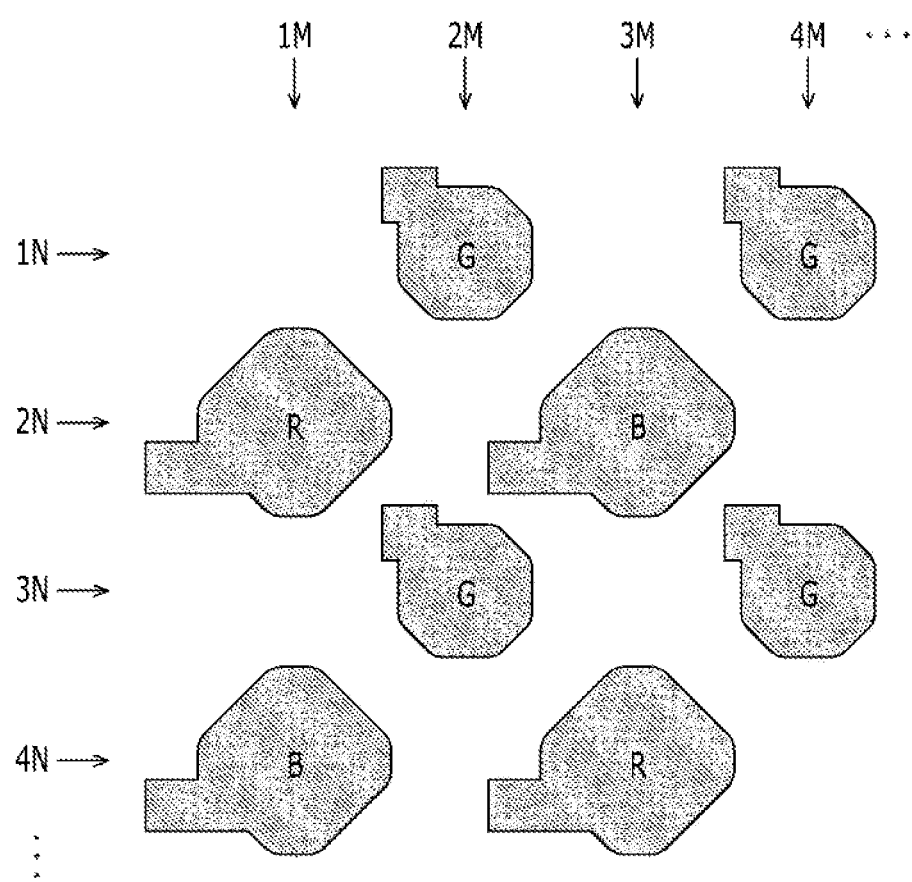
FIG. 3 is a schematic layout view of a plurality of pixels of an OLED display according to an exemplary embodiment of the present disclosure.

FIG. 3 is a schematic layout view of a plurality of pixels of an OLED display according to an exemplary embodiment of the present disclosure.

As shown in FIG. 3, a plurality of green pixels G corresponding to a second pixel are disposed to be separated by a predetermined interval in a first row 1N, a red pixel R corresponding to a first pixel and a blue pixel B corresponding to a third pixel are alternately disposed in a second row 2N adjacent thereto, a plurality of green pixels G are disposed to be separated by a predetermined interval in a third row 3N adjacent thereto, a blue pixel B and a red pixel R are alternately disposed in a fourth row 4N adjacent thereto, and the pixel arrangement is repeated to an N-th row.

In this case, the blue pixel B and the red pixel R are formed to be larger than the green pixel G.

In this case, the green pixels G disposed in the first row 1N and the red pixel R and the blue pixel B disposed in the second row 2N are alternately disposed. Accordingly, the red pixel R and the blue pixel B are alternately disposed in a first column 1M, the green pixels G are disposed to be spaced apart from each other by a predetermined interval in an adjacent second column 2M, the blue pixel B and the red pixel R are alternately formed in an adjacent third column 3M, and the green pixels G are disposed to be spaced apart from each other by a predetermined interval in an adjacent fourth column 4M, and the disposition of the pixels is repeated up to an M-th column.

The aforementioned pixel disposition structure is referred to as a pentile matrix, and high definition with a small number of pixels may be implemented by adopting rendering driving of sharing adjacent pixels to express colors.

Now, a detailed structure of the OLED display according to an exemplary embodiment of the present disclosure applied with the pixel arrangement illustrated in FIG. 3 will be described in detail with reference to FIGS. 4, 5, 6, 7, and 8.

Figure 4:
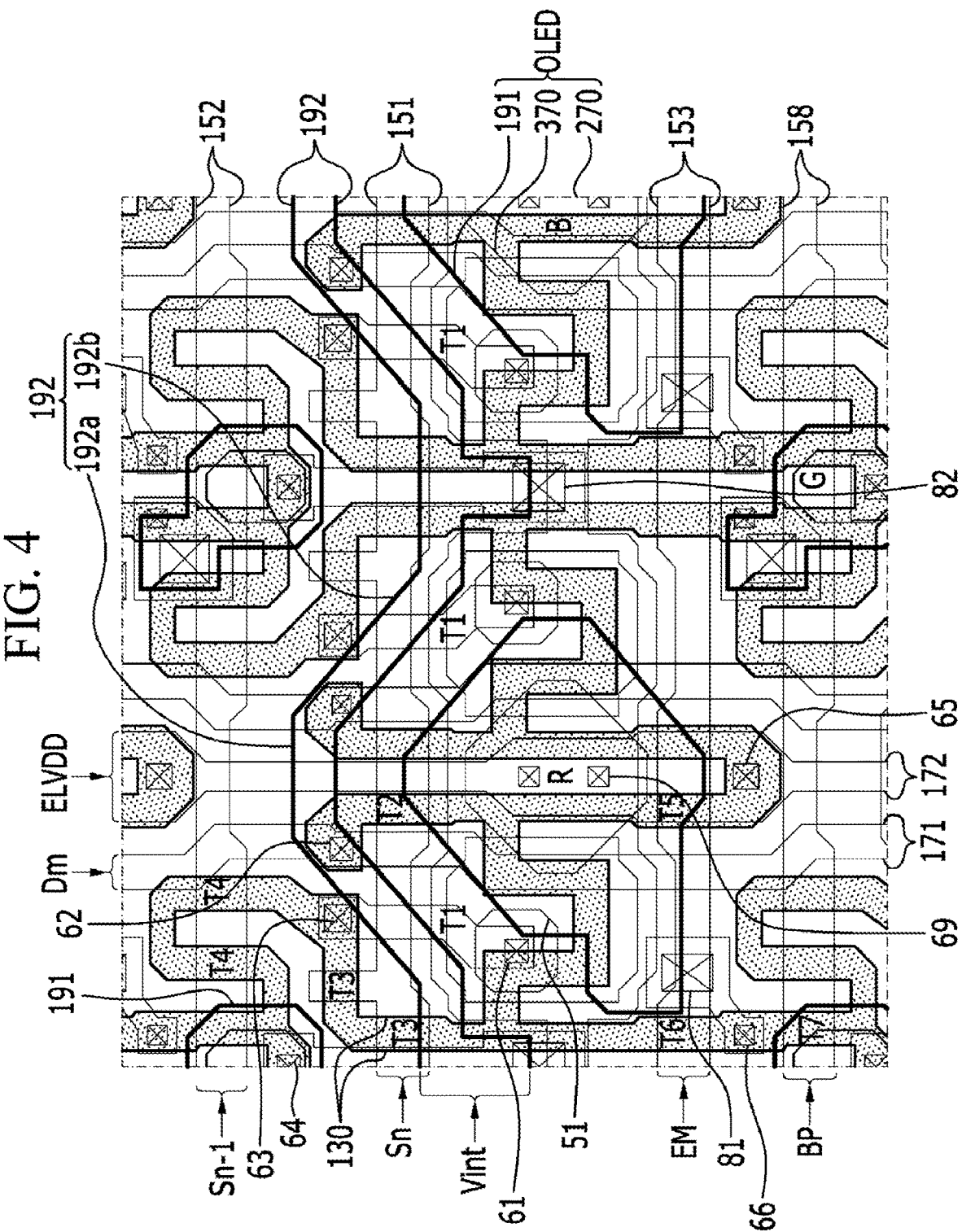
FIG. 4 is a schematic layout view of a transistor and a capacitor forming a red pixel, a green pixel, and a blue pixel of an OLED display according to an exemplary embodiment of the present disclosure.
Figure 5:
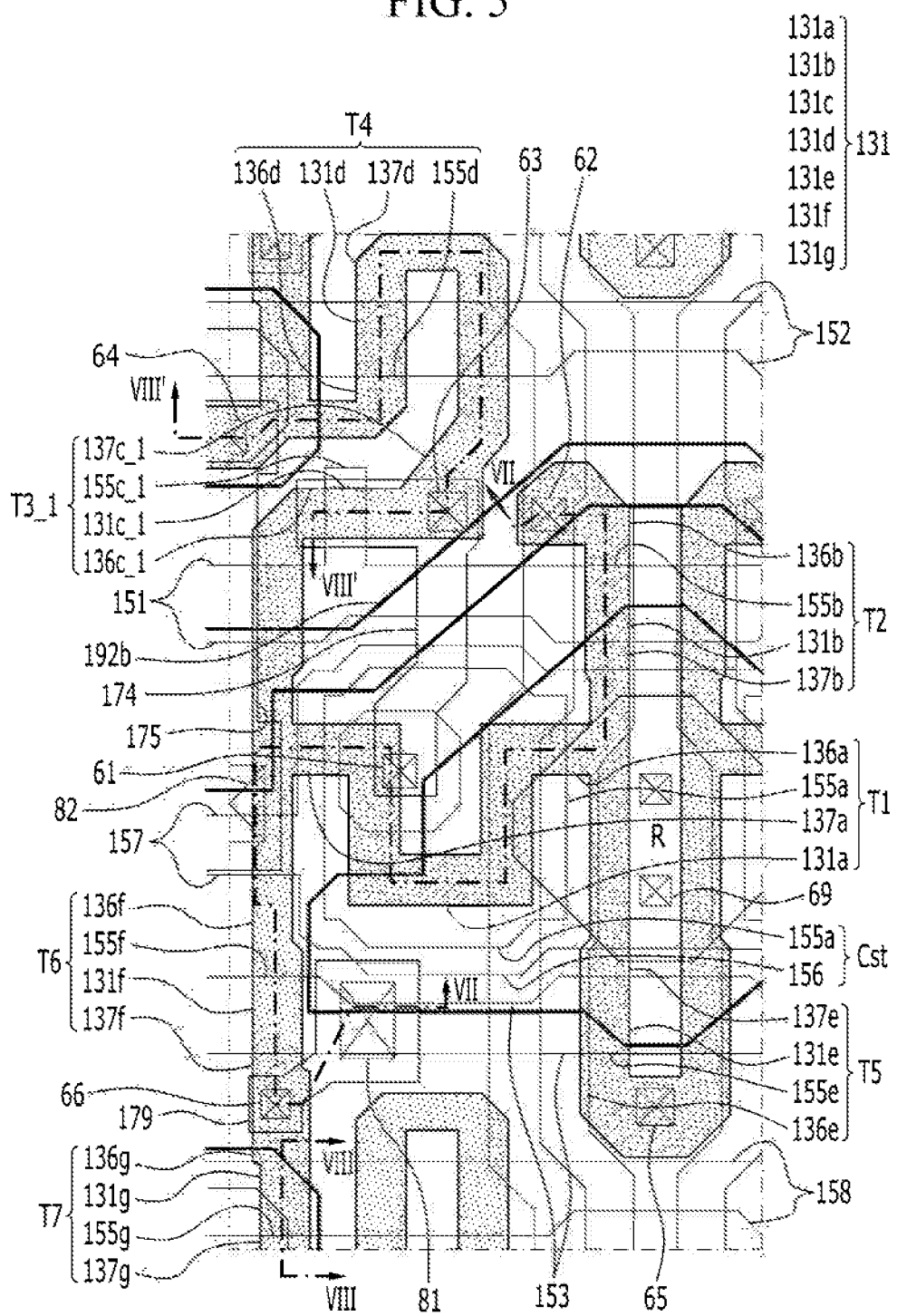
FIG. 5 is a detailed layout view of one pixel of FIG. 4.
Figure 6:
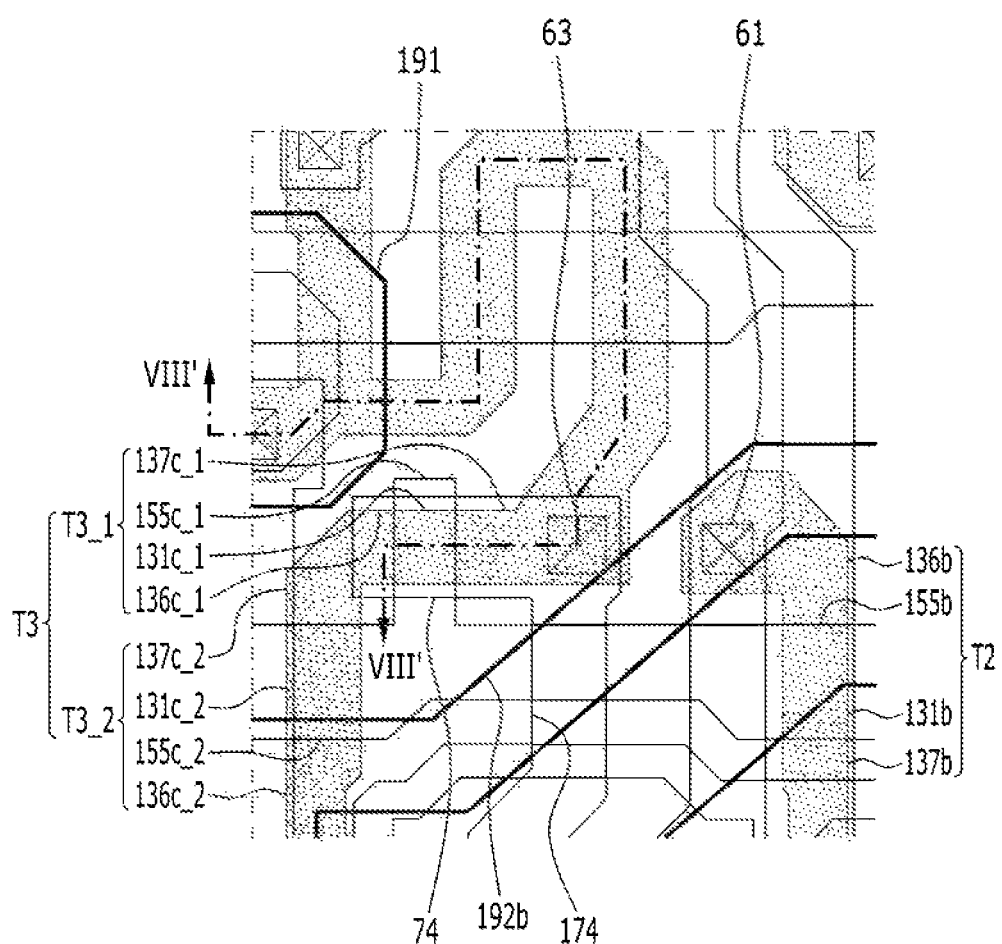
FIG. 6 is an enlarged layout view of a switching transistor T2 and a compensation transistor T3 of FIG. 4.
Figure 7:
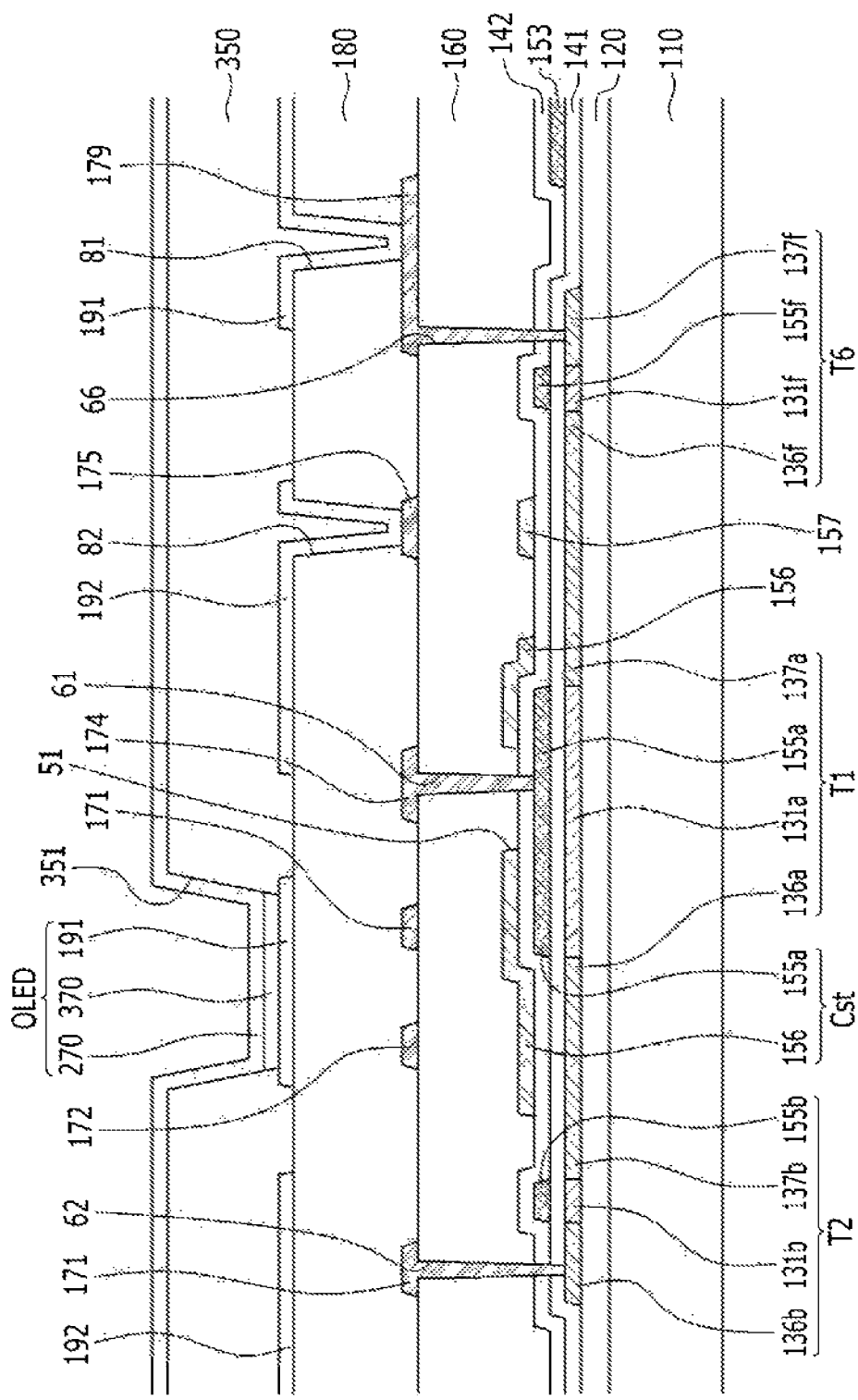
FIG. 7 is a cross-sectional view of the OLED display of FIG. 5 taken along line VII-VII.
Figure 8:
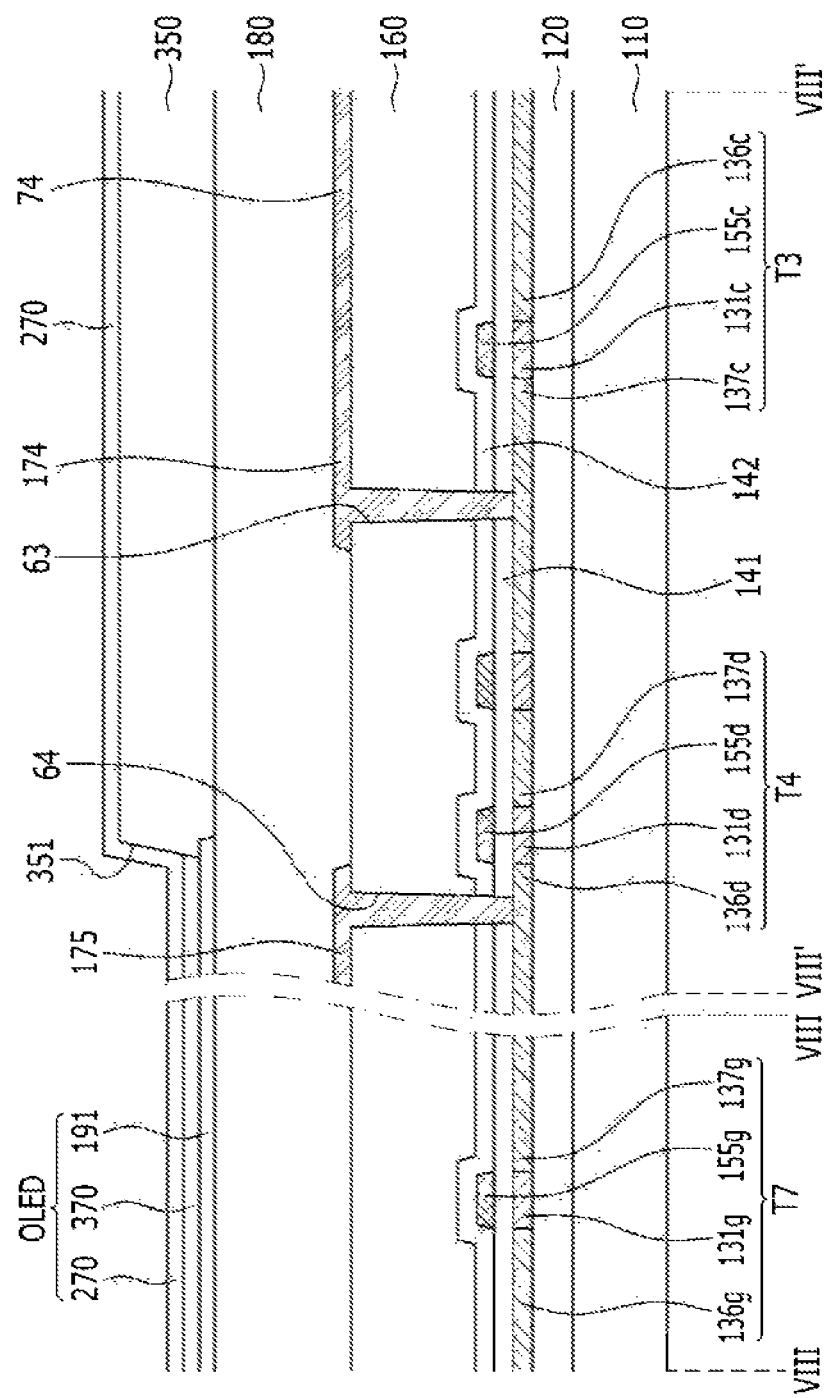
FIG. 8 is a cross-sectional view of the OLED display of FIG. 6 taken along lines VIII-VIII and FIG. 9 is an enlarged layout view of a switching transistor T2 and a compensation transistor T3 of an OLED display according to another exemplary embodiment of the present disclosure.

FIG. 4 is a schematic layout view of a transistor and a capacitor forming a red pixel, a green pixel, and a blue pixel of an OLED display according to an exemplary embodiment of the present disclosure. FIG. 5 is a detailed layout view of one pixel of FIG. 4. FIG. 6 is an enlarged layout view of a switching transistor T2 and a compensation transistor T3 of FIG. 4. FIG. 7 is a cross-sectional view of the OLED display of FIG. 5 taken along line VII-VII. FIG. 8 is a cross-sectional view of the OLED display of FIG. 6 taken along lines VIII-VIII and VIII'-VIII'.

Hereinafter, a detailed planar structure of the OLED display according to the exemplary embodiment of the present disclosure will be described in detail with reference to FIGS. 4, 5, and 6, and a detailed cross-sectional structure will be described in detail with reference to FIGS. 7 and 8.

As shown in FIGS. 4, 5, and 6, the OLED display according to an exemplary embodiment of the present disclosure includes gate metal lines 151, 152, 153, and 158 including the scan line 151, the previous scan line 152, the light emission control line 153, and the bypass control line 158, which respectively transmit the scan signal Sn, the previous scan signal Sn−1, the light emission control signal EM, and the bypass signal BP, and which are formed in a row direction.

The bypass control line 158 may be substantially the same as the previous scan line 152 in the exemplary embodiment of the present disclosure.

Also, data lines 171 and 172 including the data line 171 and the driving voltage line 172 crossing the scan line 151, the previous scan line 152, the light emission control line 153, and the bypass control line 158, along with respectively transmitting the data signal Dm and the driving voltage ELVDD to the pixel PX may be further included.

The initialization voltage Vint may be transmitted from the initialization voltage line 192 via the initialization transistor T4 to the compensation transistor T3.

The initialization voltage line 192 may be formed while alternately having a straight portion 192a and an oblique portion 192b.

The straight portion 192a may be disposed to be parallel to the scan line 121, and the oblique portion 192b may extend at a predetermined angle with the straight portion 192a.

Also, the pixel PX may be provided with the driving transistor T1, the switching transistor T2, the compensation transistor T3, the initialization transistor T4, the operation control transistor T5, the light emission control transistor T6, the bypass transistor T7, the storage capacitor Cst, and the OLED.

The OLED may include a pixel electrode 191, an organic emission layer 370, and a common electrode 270.

In this case, the compensation transistor T3 and the initialization transistor T4 may be configured of a transistor having a dual gate structure to cut off current leakage.

Each channel of the driving transistor T1, the switching transistor T2, the compensation transistor T3, the initialization transistor T4, the operation control transistor T5, the light emission control transistor T6, and the bypass transistor T7 may be formed inside one connected semiconductor member (or semiconductor layer) 130, which may be bent in various shapes.

The semiconductor member 130 may be formed of polysilicon or an oxide semiconductor.

The oxide semiconductor may include any one of the oxides based on titanium (Ti), hafnium (Hf), zirconium (Zr), aluminum (Al), tantalum (Ta), germanium (Ge), zinc (Zn), gallium (Ga), tin (Sn), or indium (In), and indium-gallium-zinc oxide (InGaZnO4), indium-zinc oxide (In—Zn—O), zinc tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof.

In the case the semiconductor member 130 is formed of an oxide semiconductor, another passivation layer for protecting the oxide semiconductor, which is vulnerable to an external environment such as a high temperature, may be added.

The semiconductor member 130 may include a channel which is doped with an N-type impurity or a P-type impurity, and a source doping area and a drain doping area which are formed at respective sides of the channel and have a higher doping concentration than that of the doping impurity doped in the channel.

In the exemplary embodiment, the source doping area and the drain doping area correspond to the source electrode and the drain electrode, respectively.

The source electrode and the drain electrode formed in the semiconductor member 130 may be formed by doping only the corresponding areas.

Further, in the semiconductor member 130, an area between the source electrode of one transistor and the drain electrode of another transistor adjacent to the one transistor may be doped, and thus the source electrode and the drain electrode may be electrically connected to each other.

As shown in FIG. 5, the channel 131, which is one area of the semiconductor member 130, includes a driving channel 131a formed in the drive transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 may include the driving channel 131a, a driving gate electrode 155a, a driving source electrode 136a, and a driving drain electrode 137a.

The driving channel 131a may be curved (or non-linear), and may have a meandering shape or a zigzag shape.

As such, by forming the curved driving channel 131a, the driving channel 131a may be formed to extend in a narrow space.

Accordingly, a driving range of the driving gate-source voltage Vgs between the driving gate electrode 155a and the driving source electrode 136a may be increased by the extended driving channel 131a.

Since the driving range of the driving gate-source voltage Vgs is increased, a grayscale of light emitted from the OLED may be finely controlled by changing the magnitude of the driving gate-source voltage Vgs, and as a result, the resolution of the OLED display may be enhanced and display quality may be improved.

Various examples such as a 'reverse S', 'S', 'M', and 'W' may be implemented by variously modifying the shape of the driving channel 131a.

The driving gate electrode 155a may overlap the driving channel 131a, and the driving source electrode 136a and the driving drain electrode 137a may be formed to be adjacent to respective sides of the driving channel 131a.

The driving gate electrode 155a may be connected to a driving connecting member 174 through a contact hole 61.

The driving gate electrode 155a may correspond to the gate metal line, and the driving connecting member 174 may correspond to the data metal line.

The switching transistor T2 may include the switching channel 131b, a switching gate electrode 155b, a switching source electrode 136b, and a switching drain electrode 137b.

The switching gate electrode 155b, which is an area of the scan line 151, may overlap the switching channel 131b, and the switching source electrode 136b and the switching drain electrode 137b are formed to be adjacent to respective sides of the switching channel 131b.

The switching source electrode 136b may be connected to the data line 171 through a switching contact hole 62.

Two compensation transistors T3 may include a first compensation transistor T3-1 and a second compensation transistor T3-2 that are adjacent to each other. Current leakage may be prevented by forming two adjacent transistors, such as the first compensation transistor T3-1 and the second compensation transistor T3-2.

The first compensation transistor T3-1 may be disposed around a projection of the scan line 121, and the second compensation transistor T3-2 may be disposed around the scan line 121.

The first compensation transistor T3-1 may include a first compensation channel 131c_1, a first compensation gate electrode 155c_1, a first compensation source electrode 136c_1, and a first compensation drain electrode 137c_1, and the second compensation transistor T3-2 may include a second compensation channel 131c_2, a second compensation gate electrode 155c_2, a second compensation source electrode 136c_2, and a second compensation drain electrode 137c_2.

The first compensation gate electrode 155c_1, which is a projection extending upward from the scan line 151, may overlap the first compensation channel 131c_1, and the first compensation source electrode 136c_1 and the first compensation drain electrode 137c_1 are formed to be adjacent to respective sides of the first compensation channel 131c1.

The first compensation drain electrode 137c_1 may be connected to the driving connecting member 174 through a contact hole 63.

The second compensation gate electrode 155c_2, which is another area of the scan line 151, may overlap the second compensation channel 131c_2. The second compensation source electrode 136c_2 and the second compensation drain electrode 137c_2 may be formed to be adjacent to respective sides of the second compensation channel 131c2.

The second compensation source electrode 136c_2 may be connected to the light emission control source electrode 136f and the driving drain electrode 137a, and the second compensation drain electrode 137c_2 may be connected to the first compensation source electrode 136c_1.

The initialization transistor T4 may include the initialization channel 131d, an initialization gate electrode 155d, an initialization source electrode 136d, and an initialization drain electrode 137d.

The initialization gate electrode 155d, which is one area of the previous scan line 152, may be formed as two in order to prevent the current leakage, and may overlap the initialization channel 131d.

The initialization source electrode 136d and the initialization drain electrode 137d may be formed to be adjacent to respective sides of the initialization channel 131d.

The initialization source electrode 136d may be connected to an initialization connecting member 175 through a contact hole 64.

The operation control transistor T5 may include the operation control channel 131e, an operation control gate electrode 155e, an operation control source electrode 136e, and an operation control drain electrode 137e.

The operation control gate electrode 155e, which is an area of the light emission control line 153, may overlap the operation control channel 131e, and the operation control source electrode 136e and the operation control drain electrode 137e may be formed to be adjacent to respective sides of the operation control channel 131e.

The operation control source electrode 136e may be connected to an area of the driving voltage line 172 through a contact hole 65.

The light emission control transistor T6 may include the light emission control channel 131f, a light emission control gate electrode 155f, a light emission control source electrode 136f, and a light emission control drain electrode 137f.

The light emission control gate electrode 155f, which is another area of the light emission control line 153, may overlap the light emission control channel 131f. The light emission control source electrode 136f and the light emission control drain electrode 137f may be formed to be adjacent to respective sides of the light emission control channel 131f.

The light emission control drain electrode 137f may be connected to a pixel connecting member 179 through a contact hole 66.

The bypass transistor T7 may include the bypass channel 131g, a bypass gate electrode 155g, a bypass source electrode 136g, and a bypass drain electrode 137g.

The bypass gate electrode 155g, which is an area of the bypass control line 158, may overlap the bypass channel 131g. The bypass source electrode 136g and the bypass drain electrode 137g may be formed to be adjacent to respective sides of the bypass channel 131g.

The bypass source electrode 136g may be connected directly to the light emission control drain electrode 137f, and the bypass drain electrode 137g may be connected directly to the initialization source electrode 136d.

One terminal of the driving channel 131a of the driving transistor T1 may be connected to the switching drain electrode 137b and the operation control drain electrode 137e, and the other terminal of the driving channel 131a may be connected to the compensation source electrode 136c and the light emission control source electrode 136f.

The capacitor Cst may include the first storage electrode 155a and a second storage electrode 156, with a second gate insulating layer 142 disposed therebetween.

The first storage electrode 155a may correspond to the driving gate electrode 155a. The second storage electrode 156 may be a portion extending from the storage line 157, may occupy a wider area than that of the driving gate electrode 155a, and may completely cover the driving gate electrode 155a.

Here, the second gate insulating layer 142 may be formed of a dielectric material, and storage capacitance may be determined by a charge charged in the storage capacitor Cst and a voltage between both electrodes 155a and 156.

As such, the driving gate electrode 155a may be used as the first storage electrode 155a, and thus a space in which the storage capacitor may be formed may be secured in a space that is narrowed due to the driving channel 131a occupying a large area within the pixel.

The first storage electrode 155a, which is the driving gate electrode 155a, may be connected to one terminal of the driving connecting member 174 through the driving contact hole 61 and a storage opening 51.

The storage opening 51 is an opening formed in the second storage electrode 156.

Accordingly, the driving contact hole 61, which connects one terminal of the driving connecting member 174 to the driving gate electrode 155a, may be formed inside the storage opening 156.

The driving connecting member 174 may be formed on the same layer as the data line 171 to be substantially parallel thereto. The other terminal of the driving connecting member 174 may be connected to the compensation drain electrode 137c of the compensation transistor T3 and the initialization drain electrode 137d of the initialization transistor T4 through the compensation contact hole 63.

Accordingly, the driving connecting member 174 may connect the driving gate electrode 155a and the compensation drain electrode 137c of the compensation transistor T3 to the initialization drain electrode 137d of the initialization transistor T4.

The second storage electrode 156 may be connected to the driving voltage line 172 through a contact hole 69.

Accordingly, the storage capacitor Cst may store storage capacitance corresponding to a difference between the driving voltage ELVDD transmitted to the second storage electrode 156 through the driving voltage line 172 and the driving gate voltage Vg of the driving gate electrode 155*a*.

A light blocking member (or light blocking layer) 74 may extend from the driving connecting member 174, and thus may overlap the first compensation transistor T3_1.

For example, the light blocking member 74 may overlap and cover each of the first compensation gate electrode 155*c*_1, the first compensation source electrode 136*c*_1, and the first compensation drain electrode 137*c*_1.

Accordingly, external light may be prevented from entering the first compensation source electrode 136*c*_1 and the first compensation drain electrode 137*c*_1, thereby preventing the current leakage from occurring in the first compensation transistor T3_1.

Also, the current leakage is prevented from occurring in the first compensation transistor T3_1, thereby suppressing a voltage change of the storage capacitor Cst connected with the driving connecting member 174 connected to the first compensation transistor T3_1 to prevent the deterioration of luminance and the change of color coordination.

In addition, flickering may be prevented by minimizing the deterioration of luminance, enabling the manufacturing of the OLED display with the low frequency driving type, and the manufacturing of the OLED display that can be driven with a low voltage.

Meanwhile, the pixel connecting member 179 may be connected to the pixel electrode 191 through a contact hole 81, and the initialization connecting member 175 may be connected to the initialization voltage line 192 through a contact hole 82.

Hereinafter, the cross-sectional structures of the OLED display according to an exemplary embodiment of the present disclosure will be described in detail according to a stacking order with reference to FIGS. 7 and 8.

In this case, since the stacked structures of the operation control transistor T5 are substantially the same as that of the light emission control transistor T6, a detailed description thereof will be omitted.

A buffer layer 120 may be formed on a substrate 110.

The substrate 110 may be formed of an insulating material such as glass, crystal, ceramic, or plastic, and the buffer layer 120 blocks impurities from the insulating substrate 110 during a crystallization process for forming polysilicon to serve to improve characteristics of the polysilicon and reduce stress applied to the substrate 110.

The semiconductor member 130 including the channel 131, which includes the driving channel 131*a*, the switching channel 131*b*, the compensation channel 131*c*, the initialization channel 131*d*, the operation control channel 131*e*, the light emission control channel 131*f*, and the bypass channel 131*g*, may be formed on the buffer layer 120.

The driving source electrode 136*a* and the driving drain electrode 137*a* may be formed at respective sides of the driving channel 131*a* in the semiconductor member 130, and the switching source electrode 136*b* and the switching drain electrode 137*b* may be formed at respective sides of the switching channel 131*b*.

The compensation source electrode 136*c* and the compensation drain electrode 137*c* may be formed at respective sides of the compensation channel 131*c*, and the initialization source electrode 136*d* and the initialization drain electrode 137*d* may be formed at respective sides of the initialization channel 131*d*.

The operation control source electrode 136*e* and the operation control drain electrode 137*e* may be formed at respective sides of the operation control channel 131*e*, and the emission control source electrode 136*f* and the emission control drain electrode 137*f* may be formed at respective sides of the emission control channel 131*f*.

The bypass source electrode 136*g* and the bypass drain electrode 137*g* may be formed at respective sides of the bypass channel 131*g*.

A first gate insulating layer 141 covering the semiconductor member 130 is formed thereon.

First gate metal lines 151, 152, 153, and 155*a*, including the scan line 151, which includes the switching gate electrode 155*b* and the compensation gate electrode 155*c*, the previous scan line 152, which includes the initialization gate electrode 155*d* and the bypass gate electrode 155*g*, the light emission control line 153, which includes the operation control gate electrode 155*e* and the light emission control gate electrode 155*f*, and the driving gate electrode (the first storage electrode) 155*a* may be formed on the first gate insulating layer 141.

The second gate insulating layer 142 covering the first gate metal lines 151, 152, 153, and 155*a* and the first gate insulating layer 141 may be formed thereon.

The first gate insulating layer 141 and the second gate insulating layer 142 may be formed of a silicon nitride (SiNx) or a silicon oxide (SiOx).

Second gate metal lines 157 and 156, including a storage line 157 parallel to the scan line 151 and the storage electrode 156 as an expansion of the storage line 157, may be formed on the second gate insulating layer 142.

The second storage electrode 156 may be wider than the first storage electrode 155*a* functioning as the driving gate electrode, such that the second storage electrode 156 completely covers the driving gate electrode 155*a*.

Gate metal lines 151, 152, 153, 155*a*, 156, and 157, including the first gate metal lines 151, 152, 153, 155*a* and the second gate metal lines 156 and 157, may be formed of multiple layers in which metal layers formed of any of copper (Cu), a copper alloy, aluminum (Al), an aluminum alloy, molybdenum (Mo), and a molybdenum alloy are stacked.

An interlayer insulating layer 160 may be formed on the second gate insulating layer 142 and the second gate metal lines 157 and 156.

The interlayer insulating layer 160 may be formed of a silicon nitride (SiNx) or a silicon oxide (SiOx).

The interlayer insulating layer 160 has contact holes 61, 62, 63, 64, 65, 66, and 69.

Data metal lines 171, 172, 174, 175, and 179, including a data line 171, a driving voltage line 172, a driving connecting member 174, an initialization connecting member 175, and a pixel connecting member 179, may be formed on the interlayer insulating layer 160.

The data metal lines 171, 172, 174, 175, and 179 may be formed of multiple layers in which metal layers including any of copper (Cu), a copper alloy, aluminum (Al), an aluminum alloy, molybdenum (Mo), and a molybdenum alloy are stacked, and for example, is formed of a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

The data line 171 is connected to the switching source electrode 136*b* through the switching contact hole 62 formed in the first gate insulating layer 141, the second gate insulating layer 142, and the interlayer insulating layer 160. One terminal of the driving connecting member 174 is connected to the first storage electrode 155a through the driving contact hole 61 formed in the second gate insulating layer 142 and the interlayer insulating layer 160. The other terminal of the driving connecting member 174 is connected to the compensation drain electrode 137c and the initialization drain electrode 137d through the compensation contact hole 63 formed in the first gate insulating layer 141, the second gate insulating layer 142, and the interlayer insulating layer 160.

The light blocking member 74 extending from the other terminal of the driving connecting member 174 may be formed on the same layer as the data line 171 and may overlap the first compensation transistor T3_1.

Since the light blocking member 74 may overlap each of the first compensation gate electrode 155c_1, the first compensation source electrode 136c_1, and the first compensation drain electrode 137c_1, and thus may be covered thereon. The current leakage in the first compensation gate transistor due to external light can be prevented, and the deterioration of luminance and the change of color coordination can be prevented. Moreover, flickering may be prevented, enabling the manufacturing of the OLED display with the low frequency driving type, and the manufacturing of the OLED display capable of being driven with a low voltage.

The initialization connecting member 175 parallel to the data line 171 may be connected to the initialization source electrode 136d through the initialization contact hole 64 formed in the first gate insulating layer 141, the second gate insulating layer 142, and the interlayer insulating layer 160.

Also, the pixel connecting member 179 may be connected to the light emission control drain electrode 137f through the light emission control contact hole 66 formed in the first gate insulating layer 141, the second gate insulating layer 142, and the interlayer insulating layer 160.

A passivation layer 180 covering the data metal lines 171, 172, 174, 175, and 179 and the interlayer insulating layer 160 is formed thereon.

The passivation layer 180 covers the data metal lines (171, 172, 174, 175, and 179) to be flattened such that the pixel electrode 191 may be formed on the passivation layer 180 without a step. The passivation layer 180 may be formed of a stacked layer of an organic material such as a polyacrylate resin, a polyimide resin, or the like, or a stacked layer of an organic material and an inorganic material.

The pixel electrode 191 and the initialization voltage line 192 may be formed on the passivation layer 180.

The pixel connecting member 179 may be connected to the pixel electrode 191 through the contact hole 81 formed in the passivation layer 180, and the initialization connecting member 175 may be connected to the initialization voltage line 192 through the contact hole 82 formed in the passivation layer 180.

A pixel definition layer (PDL) 350 covering the passivation layer 180, the initialization voltage line 192, and the edge of the pixel electrode 191 may be formed thereon, and the pixel definition layer 350 may have a pixel opening 351 exposing the pixel electrode 191.

The pixel definition layer 350 may be formed of organic materials such as a polyacrylate resin, a polyimide resin, and the like, and silica-based organic materials.

An organic emission layer 370 may be formed on the pixel electrode 191 exposed through the pixel opening 351. A common electrode 270 may be formed on the organic emission layer 370.

The common electrode 270 may also be formed on the pixel definition layer 350 over the plurality of pixels PX.

As such, the OLED, including the pixel electrode 191, the organic emission layer 370, and the common electrode 270, may be formed.

Here, the pixel electrode 191 may be an anode which is a hole injection electrode, and the common electrode 270 may be a cathode which is an electron injection electrode. However, the exemplary embodiment according to the present disclosure is not necessarily limited thereto, and the pixel electrode 191 may be the cathode and the common electrode 270 may be the anode depending on a driving method.

When holes and electrons are injected into the organic emission layer 370 from the pixel electrode 191 and the common electrode 270, respectively, and excitons acquired by combining the injected holes and electrons fall from an excitation state to a ground state, light may be emitted.

The organic emission layer 370 may be formed of a low-molecular organic material or a high-molecular organic material such as poly(3,4-ethylenedioxythiophene) (PEDOT).

Further, the organic emission layer 370 may be formed with multiple layers including at least one of an emission layer, a hole injection layer (HIL), a hole transporting layer (HTL), an electron transporting layer (ETL), and an electron injection layer (EIL).

When the organic emission layer 370 includes all of the layers, the hole injection layer is disposed on the pixel electrode 191, which is the positive electrode, and the hole transporting layer, the light emission layer, the electron transporting layer, and the electron injection layer are sequentially laminated thereon.

The organic emission layer 370 may include a red organic emission layer emitting red light, a green organic emission layer emitting green light, and a blue organic emission layer emitting blue light. The red organic emission layer, the green organic emission layer, and the blue organic emission layer are formed at a red pixel, a green pixel, and a blue pixel, respectively, to implement color images.

Further, in the organic emission layer 370, all of the red organic emission layer, the green organic emission layer, and the blue organic emission layer are laminated together on the red pixel, the green pixel, and the blue pixel. A red color filter, a green color filter, and a blue color filter are formed for each pixel to implement the color images.

As another example, a white organic emission layer emitting white light is formed on all of the red pixel, the green pixel, and the blue pixel. The red color filter, the green color filter, and the blue color filter are formed for each pixel to implement the color images.

When the color images are implemented by using the white organic emission layer and the color filters, a deposition mask for depositing the red organic emission layer, the green organic emission layer, and the blue organic emission layer on individual pixels, i.e., the red pixel, the green pixel, and the blue pixel, respectively, may not be used.

The white organic emission layer described in another example is formed by one organic emission layer, and includes even a configuration that may emit white light by laminating a plurality of organic emission layers.

For example, the white organic emission layer includes a configuration that enables the white light to be emitted by combining at least one yellow organic emission layer and at least one blue organic emission layer, a configuration that enables the white light to be emitted by combining at least one cyan organic emission layer and at least one red organic emission layer, a configuration that enables the white light to be emitted by combining at least one magenta organic emission layer and at least one green organic emission layer, and the like.

An encapsulation member (not shown) protecting the OLED may be formed on the common electrode 270, and the encapsulation member may be sealed to the substrate 110 by a sealant and may be formed of various materials such as glass, quartz, ceramic, plastic, and a metal. A thin film encapsulation layer may be formed on the common electrode 270 by depositing the inorganic layer and the organic layer with the usage of the sealant.

In the exemplary embodiment, the light blocking member covers only the first compensation transistor to prevent external light from entering the first compensation transistor, however the light blocking member may cover not only the first compensation transistor but also the second compensation transistor to prevent external light from entering the first compensation transistor and the second compensation transistor as another exemplary embodiment.

Hereinafter, the OLED display according to another exemplary embodiment of the present disclosure will be described with reference to FIG. 9.

Figure 9:
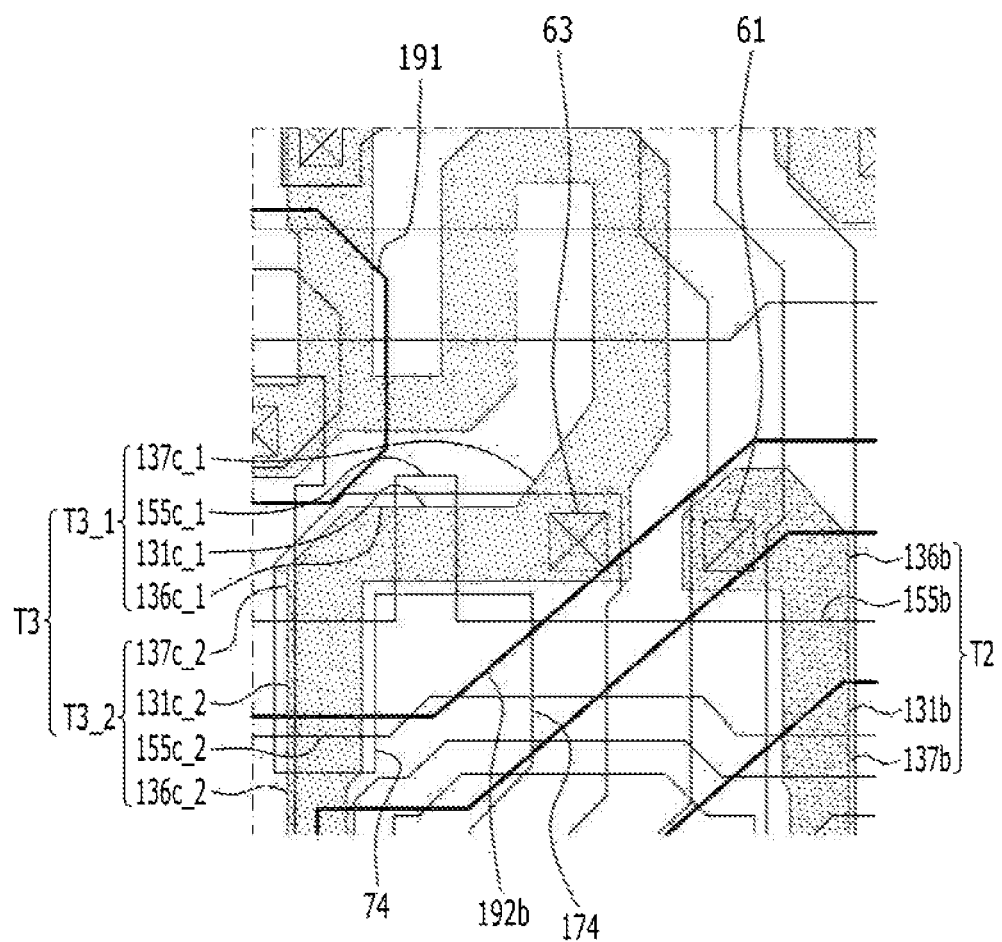

FIG. 9 is an enlarged layout view of a switching transistor T2 and a compensation transistor T3 of an OLED display according to another exemplary embodiment of the present disclosure.

Another exemplary embodiment shown in FIG. 9 is substantially the same as the exemplary embodiment shown in FIGS. 4, 5, 6, 7, and 8, except for the light blocking member covering both the first compensation transistor and the second compensation transistor, and thus a duplicate description thereof is omitted.

As shown in FIG. 9, the light blocking member 74 of the OLED display according to another exemplary embodiment of the present disclosure extends from the driving connecting member 174 to the left side in a plan view, and may extend from a terminal thereof to a lower side in a plan view.

The light blocking member 74 may overlap the first compensation transistor T3_1 and the second compensation transistor T3_2.

Since the light blocking member 74 may be formed on the same layer as the data line 171, the light blocking member 74 may cover each of the first compensation gate electrode 155c_1, the first compensation source electrode 136c_1, the first compensation drain electrode 137c_1, the second compensation gate electrode 155c_2, the second compensation source electrode 136c_2, and the second compensation drain electrode 137c_2 disposed therebelow.

Accordingly, external light may be prevented from entering the first compensation source electrode 136c_1, the first compensation drain electrode 137c_1, the second compensation source electrode 136c_2, and the second compensation drain electrode 137c_2, thereby preventing the current leakage from occurring in the first compensation transistor T3_1 and second compensation transistor T3_2. Therefore, the deterioration of luminance, the change of color coordination, and flickering can be more effectively prevented.

In the exemplary embodiment, the light blocking member is extended from the driving connecting member to be formed, however the light blocking member may be separated from the driving connecting member in another exemplary embodiment.

Hereinafter, the OLED display according to another exemplary embodiment of the present disclosure will be described with reference to FIG. 10.

Figure 10:
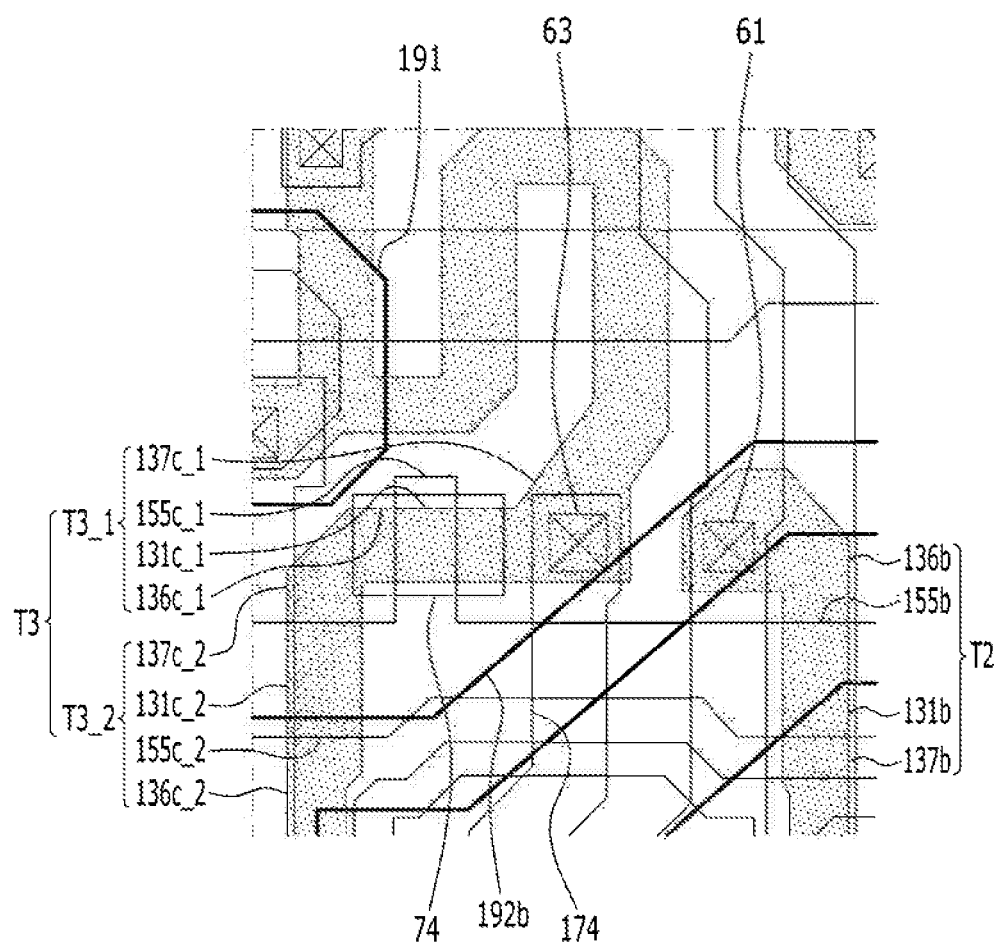
FIG. 10 is an enlarged layout view of a switching transistor T2 and a compensation transistor T3 of an OLED display according to another exemplary embodiment of the present disclosure.

FIG. 10 is an enlarged layout view of a switching transistor T2 and a compensation transistor T3 of an OLED display according to another exemplary embodiment of the present disclosure.

Another exemplary embodiment shown in FIG. 10 is substantially the same as the exemplary embodiment shown in FIGS. 4, 5, 6, 7, and 8, except for the light blocking member separated from the driving connecting member, such that a duplicate description thereof is omitted.

As shown in FIG. 10, the light blocking member 74 of the OLED display according to the other exemplary embodiment of the present disclosure is separated from the driving connecting member and overlaps the first compensation transistor T3_1.

Since the light blocking member 74 may be formed on the same layer as the data line 171, the light blocking member 74 may cover the first compensation gate electrode 155c_1, the first compensation source electrode 136c_1, and the first compensation drain electrode 137c_1 disposed therebelow.

Accordingly, external light may be prevented from entering the first compensation source electrode 136c_1 and the first compensation drain electrode 137c_1, thereby preventing the current leakage from occurring in the first compensation transistor T3_1. Therefore, the deterioration of luminance, the change of color coordination, and flickering can be prevented.

In the exemplary embodiment, the light blocking member is formed on the same layer as the data line, however the light blocking member may be formed on the same layer as the pixel electrode in another exemplary embodiment.

Hereinafter, the OLED display according to another exemplary embodiment of the present disclosure will be described with reference to FIGS. 11 and 12.

Figure 11:
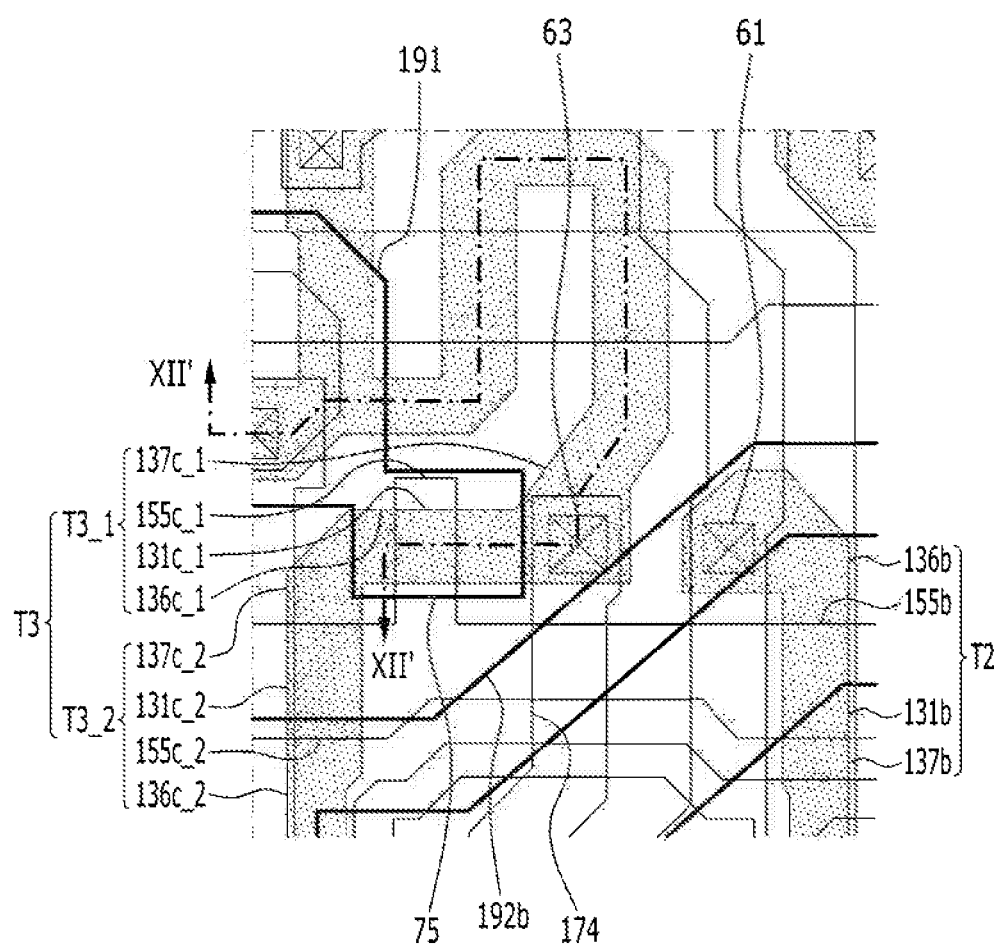
FIG. 11 is an enlarged layout view of a switching transistor T2 and a compensation transistor T3 of an OLED display according to another exemplary embodiment of the present disclosure.

FIG. 11 is an enlarged layout view of a switching transistor T2 and a compensation transistor T3 of an OLED display according to another exemplary embodiment of the present disclosure. FIG. 12 is a cross-sectional view of the OLED display of FIG. 11 taken along lines XII-XII and XII'-XII'.

Figure 12:
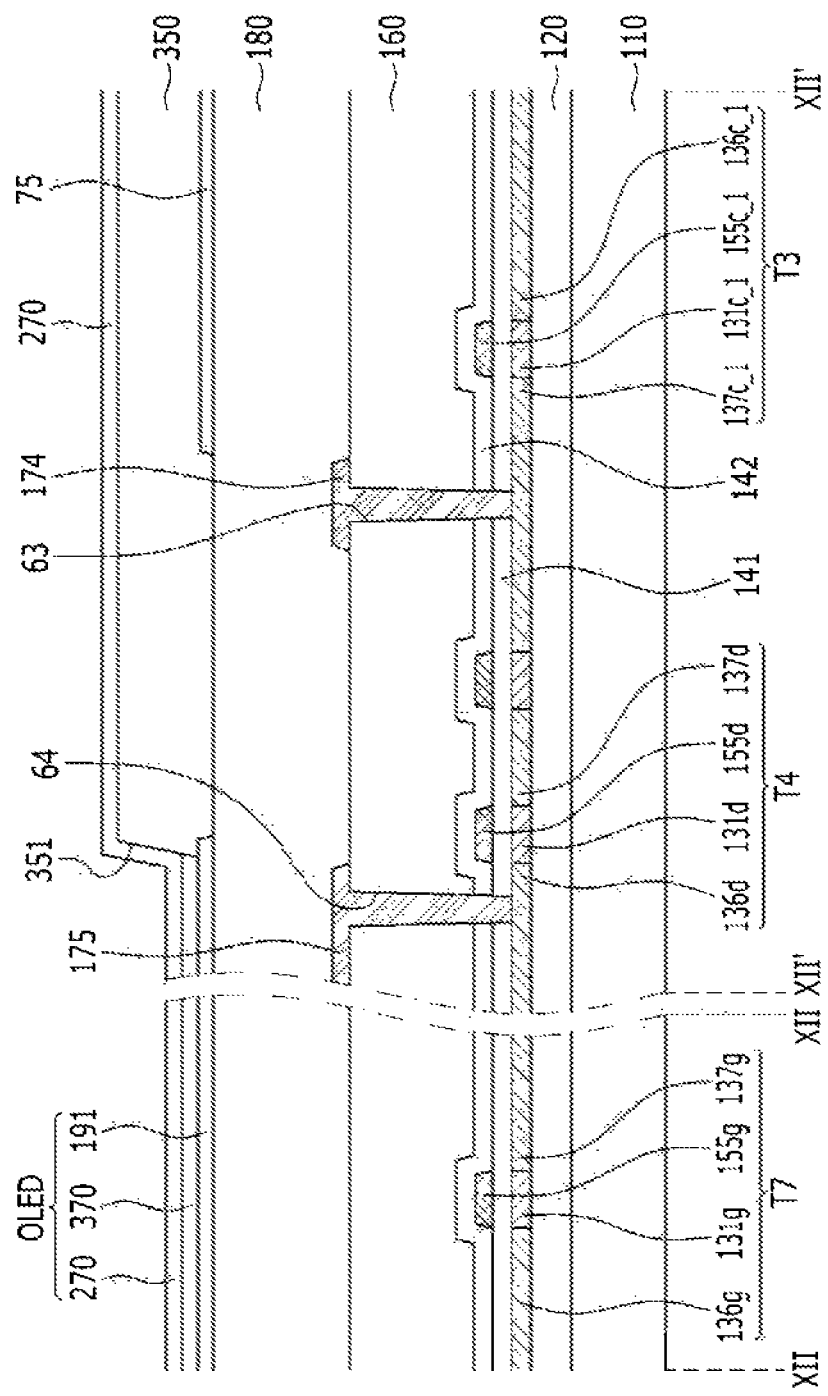
FIG. 12 is a cross-sectional view of the OLED display of FIG. 11 taken along lines XII-XII and FIG. 13 is an enlarged layout view of a switching transistor T2 and a compensation transistor T3 of an OLED display according to another exemplary embodiment of the present disclosure.

Another exemplary embodiment shown in FIGS. 11 and 12 is substantially the same as the exemplary embodiment shown in FIGS. 4, 5, 6, 7, and 8, except for the light blocking member formed on the same layer as the pixel electrode, such that duplicate description thereof is omitted.

As shown in FIGS. 11 and 12, the light blocking member 74 of the OLED display according to another exemplary embodiment of the present disclosure may extend from the pixel electrode 191 adjacent thereto and may overlap the first compensation transistor T3_1.

Since the light blocking member 75 may be formed on the same layer as the pixel electrode 191, the light blocking member 75 may cover each of the first compensation gate electrode 155c_1, the first compensation source electrode 136c_1, and the first compensation drain electrode 137c_1 formed therebelow.

Accordingly, external light may be prevented from entering the first compensation source electrode 136c_1 and the first compensation drain electrode 137c_1, thereby preventing the current leakage from occurring in the first compensation transistor T3_1. Therefore, the deterioration of luminance, the change of color coordination, and flickering may be prevented.

In the exemplary embodiment shown in FIGS. 11 and 12, the light blocking member extended from the pixel electrode covers only the first compensation transistor, however the light blocking member may cover not only the first compensation transistor but also the second compensation transistor in another exemplary embodiment.

Hereinafter, the OLED display according to another exemplary embodiment of the present disclosure will be described with reference to FIG. 13.

Figure 13:
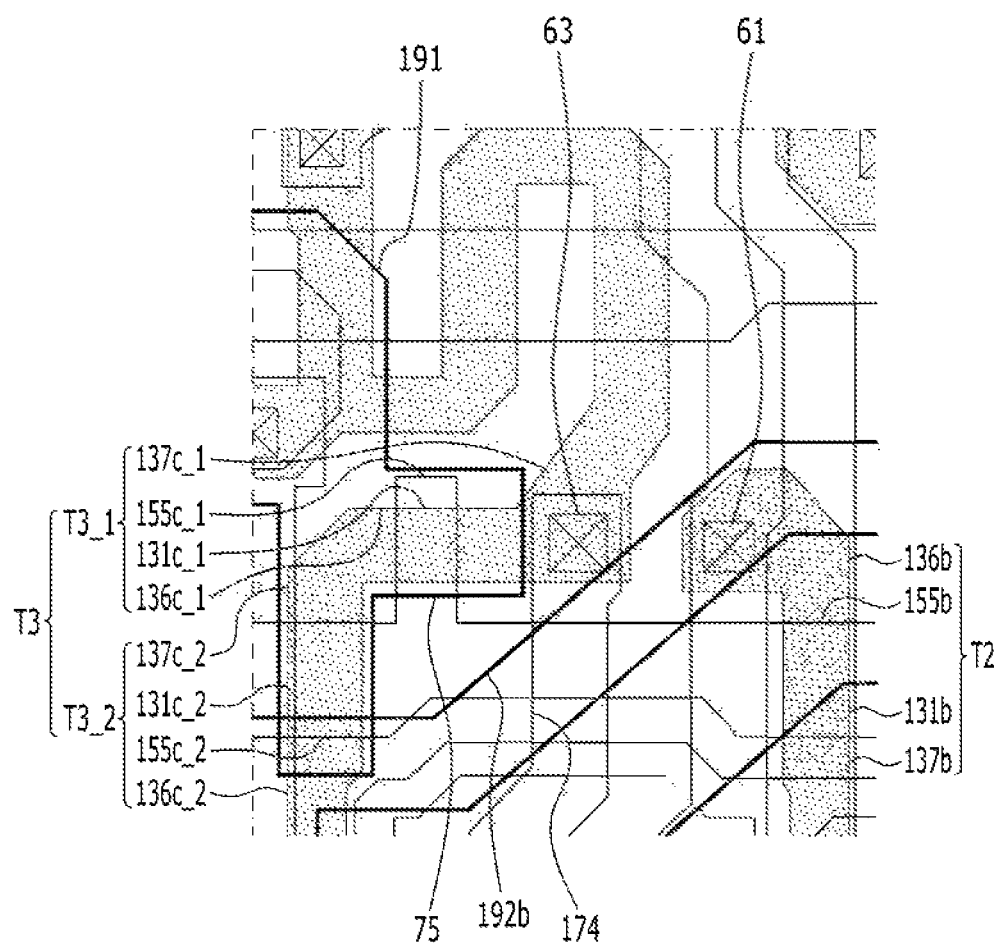

FIG. 13 is an enlarged layout view of a switching transistor T2 and a compensation transistor T3 of an OLED display according to another exemplary embodiment of the present disclosure.

Another exemplary embodiment shown in FIG. 13 is substantially the same as the exemplary embodiment shown in FIGS. 11 and 12, except for the light blocking member covering both the first compensation transistor and the second compensation transistor, such that a duplicate description thereof is omitted.

As shown in FIG. 13, the light blocking member 75 of the OLED display according to another exemplary embodiment of the present disclosure may extend from the pixel electrode 191 adjacent thereto to a lower side in a plan view and may overlap the first compensation transistor T3_1 and the second compensation transistor T3_2.

Since the light blocking member 75 may be formed on the same layer as the pixel electrode 191, the light blocking member 75 may cover each of the first compensation gate electrode 155$c$_1, the first compensation source electrode 136$c$_1, the first compensation drain electrode 137$c$_1, the second compensation gate electrode 155$c$_2, the second compensation source electrode 136$c$_2, and the second compensation drain electrode 137$c$_2 disposed therebelow.

Accordingly, external light may be prevented from entering the first compensation source electrode 136$c$_1, the first compensation drain electrode 137$c$_1, the second compensation source electrode 136$c$_2, and the second compensation drain electrode 137$c$_2, thereby preventing the current leakage from occurring in the first compensation transistor T3_1 and second compensation transistor T3_2. Therefore, the deterioration of luminance, the change of color coordination, and flickering may be more effectively prevented.

In the exemplary embodiment shown in FIG. 11 and FIG. 12, the light blocking member is extended from the pixel electrode, however the light blocking member may be separated from the pixel electrode in another exemplary embodiment.

Hereinafter, the OLED display according to another exemplary embodiment of the present disclosure will be described with reference to FIG. 14.

Figure 14:
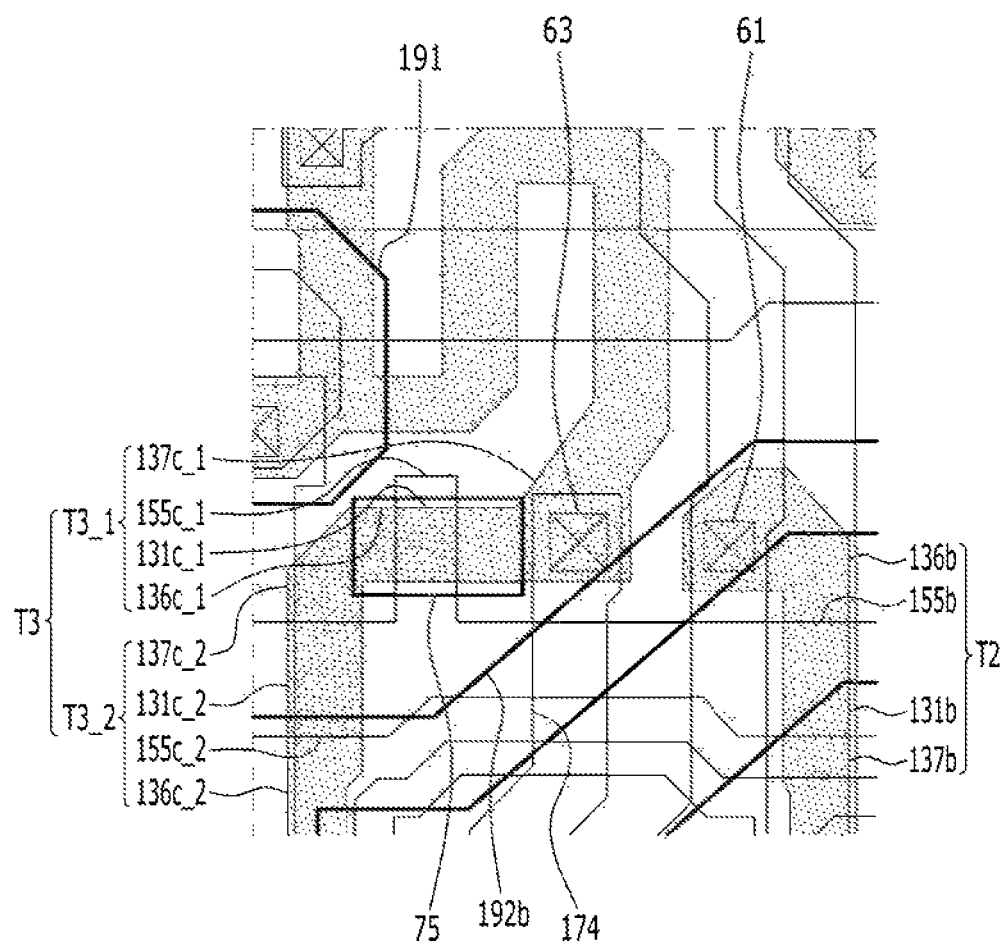
FIG. 14 is an enlarged layout view of a switching transistor T2 and a compensation transistor T3 of an OLED display according to another exemplary embodiment of the present disclosure.

FIG. 14 is an enlarged layout view of a switching transistor T2 and a compensation transistor T3 of an OLED display according to another exemplary embodiment of the present disclosure.

Another exemplary embodiment shown in FIG. 14 is substantially the same as the exemplary embodiment shown in FIGS. 11 and 12, except for the light blocking member separated from the pixel electrode, such that a duplicate description thereof is omitted.

As shown in FIG. 14, the light blocking member 75 of the OLED display according to another exemplary embodiment of the present disclosure is separated from the pixel electrode 191 adjacent thereto and the initialization voltage line 192, and overlaps the first compensation transistor T3_1.

Since the light blocking member 75 may be formed on the same layer as the pixel electrode 191, the light blocking member 75 may cover each of the first compensation gate electrode 155$c$_1, the first compensation source electrode 136$c$_1, and the first compensation drain electrode 137$c$_1 disposed therebelow. Accordingly, external light may be prevented from entering the first compensation source electrode 136$c$_1 and the first compensation drain electrode 137$c$_1, thereby preventing the current leakage from occurring in the first compensation transistor T3_1. Therefore, the deterioration of luminance, the change of color coordination, and flickering may be prevented.

In the exemplary embodiment shown in FIGS. 11 and 12, the light blocking member is extended from the pixel electrode, however the light blocking member may be extended from the initialization voltage line in another exemplary embodiment.

Hereinafter, the OLED display according to another exemplary embodiment of the present disclosure will be described with reference to FIG. 15.

Figure 15:
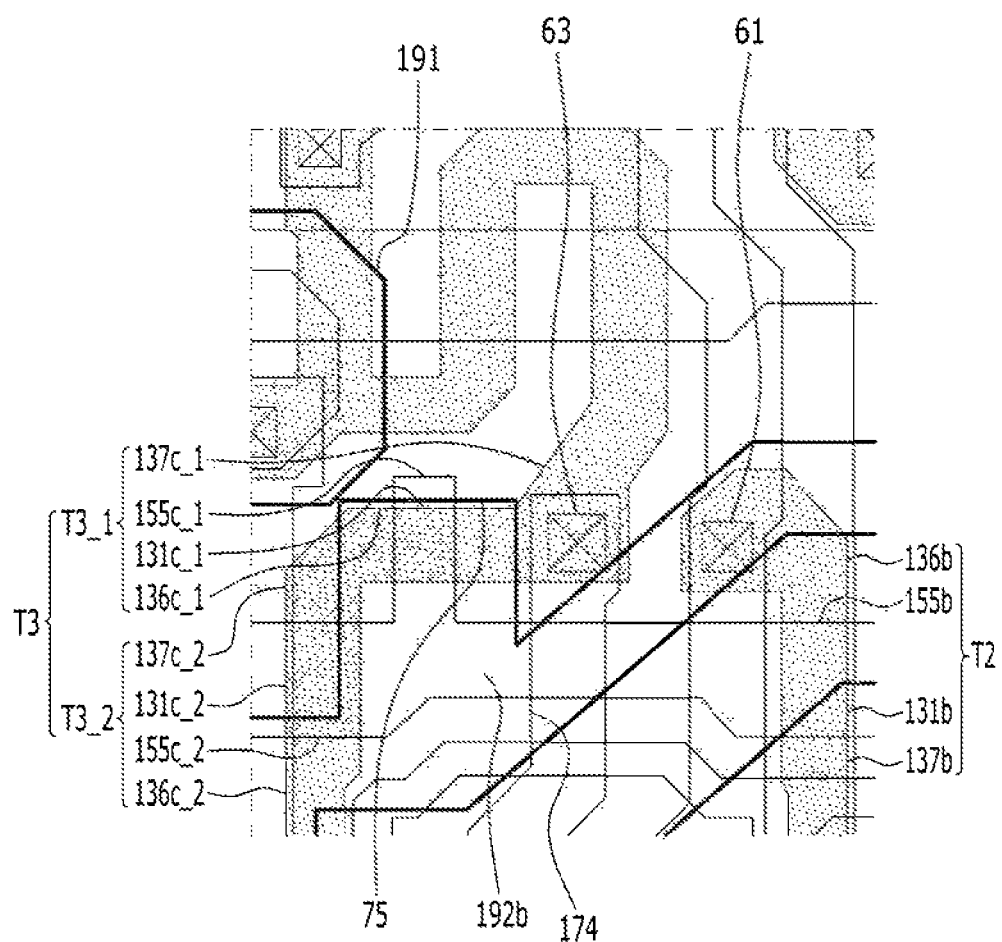
FIG. 15 is an enlarged layout view of a switching transistor T2 and a compensation transistor T3 of an OLED display according to another exemplary embodiment of the present disclosure.

FIG. 15 is an enlarged layout view of a switching transistor T2 and a compensation transistor T3 of an OLED display according to another exemplary embodiment of the present disclosure.

Another exemplary embodiment shown in FIG. 15 is substantially the same as the exemplary embodiment shown in FIGS. 11 and 12, except for the light blocking member extended from the initialization voltage line, such that a duplicate description thereof is omitted.

As shown in FIG. 15, the light blocking member 75 of the OLED display according to another exemplary embodiment of the present disclosure extends from the initialization voltage line 192 adjacent thereto to an upper side in a plan view and overlaps the first compensation transistor T3_1.

Since the light blocking member 75 may be formed on the same layer as the pixel electrode 191, the light blocking member 75 may cover each of the first compensation gate electrode 155$c$_1, the first compensation source electrode 136$c$_1, and the first compensation drain electrode 137$c$_1 disposed therebelow.

Accordingly, external light may be prevented from entering the first compensation source electrode 136$c$_1 and the first compensation drain electrode 137$c$_1, thereby preventing the current leakage from occurring in the first compensation transistor T3_1. Therefore, the deterioration of luminance, the change of color coordination, and flickering may be prevented.

While the inventive technology has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A display device comprising:
    a driving transistor configured to supply a driving current;
    a switching transistor coupled to a scan line and a data line;
    a compensation transistor including a first compensation transistor and a second compensation transistor coupled to each other, wherein the first compensation transistor comprises a first compensation gate electrode, a first compensation source electrode, and a first compensation drain electrode, and wherein the second compensation transistor comprises a second compensation gate electrode, a second compensation source electrode, and a second compensation drain electrode;
    a pixel electrode;
    an organic emission layer disposed over the pixel electrode;
    a common electrode disposed over the organic emission layer; and a covering layer covering the first compensation transistor and the second compensation transistor, wherein the covering layer covers the first compensation gate electrode, the first compensation source electrode, the first compensation drain electrode, the second compensation gate electrode, the second compensation source electrode, and the second compensation drain electrode, wherein the covering layer is an extended portion of the pixel electrode.

2. The display device of claim 1, wherein:

the scan line is configured to provide a scan signal, and the driving transistor comprises a driving gate electrode, a driving source electrode and a driving drain electrode.

3. The display device of claim 2, wherein:

the first compensation gate electrode and the second compensation gate electrode are connected to the scan line, the first compensation drain electrode is connected to the driving gate electrode, and the second compensation drain electrode and the first compensation source electrode are connected to each other, and the second compensation source electrode is connected to the driving drain electrode.

4. The display device of claim 3, wherein the driving source electrode of the driving transistor is connected to a drain electrode of the switching transistor.

5. The display device of claim 3, further comprising:

a driving connecting layer configured to electrically connect the driving gate electrode to the first compensation drain electrode.

6. The display device of claim 5, further comprising:

an initialization voltage line configured to provide an initialization voltage to the pixel electrode, wherein the covering layer has a same voltage level as the initialization voltage.

7. The display device of claim 1, wherein the covering layer has an extended portion extended in a direction that the scan line is extended.

8. The display device of claim 7, wherein the covering layer includes an oblique portion having a predetermined angle with the scan line.

9. The display device of claim 7, wherein the covering layer has another extended portion extended in a direction perpendicular to the direction that the scan line is extended.

10. The display device of claim 1, wherein the covering layer has an extended portion extended in a direction perpendicular to a direction that the scan line is extended.

11. The display device of claim 1, wherein the pixel electrode having the extended portion as the covering layer is an adjacent pixel electrode that does not receive the driving current from the driving transistor.

12. A display device, comprising:

a driving transistor configured to supply a driving current;

a switching transistor coupled to a scan line and a data line;

a compensation transistor including a first compensation transistor and a second compensation transistor coupled to each other, wherein the first compensation transistor comprises a first compensation gate electrode, a first compensation source electrode, and a first compensation drain electrode, and wherein the second compensation transistor comprises a second compensation gate electrode, a second compensation source electrode, and a second compensation drain electrode;

a pixel electrode;

an organic emission layer disposed over the pixel electrode;

a common electrode disposed over the organic emission layer;

a covering layer covering a portion of the first compensation transistor and a portion of the second compensation transistor, wherein the covering layer covers the first compensation gate electrode, the first compensation source electrode, the first compensation drain electrode, the second compensation gate electrode, the second compensation source electrode, and the second compensation drain electrode, wherein the covering layer is an extended portion of the pixel electrode.

13. The display device of claim 12, wherein:

the scan line is configured to provide a scan signal, and the driving transistor comprises a driving gate electrode, a driving source electrode and a driving drain electrode.

14. The display device of claim 13, wherein:

the first compensation drain electrode is connected to the driving gate electrode, the second compensation drain electrode and the first compensation source electrode are connected to each other, and the second compensation source electrode is connected to the driving drain electrode.

15. The display device of claim 14, wherein the covering layer includes an oblique portion forming a predetermined angle with the scan line.

16. The display device of claim 14, wherein the covering layer has another extended portion extended in a direction perpendicular to the direction that the scan line is extended.

17. The display device of claim 13, further comprising:

an initialization voltage line configured to provide an initialization voltage to the pixel electrode, wherein covering layer has a same voltage level as the initialization voltage.

18. The display device of claim 13, wherein the covering layer has an extended portion extended in a direction that the scan line is extended.

19. The display device of claim 12, wherein the covering layer has an extended portion extended in a direction perpendicular to a direction that the scan line is extended.

* * * * *